United States Patent
Tsui et al.

(10) Patent No.: US 10,269,894 B1
(45) Date of Patent: Apr. 23, 2019

(54) METHOD OF MANUFACTURING A DEEP TRENCH CAPACITOR WITH A FILLED TRENCH AND A DOPED REGION SERVING AS A CAPACITOR ELECTRODE

(71) Applicant: TAIWAN SEMICONDUCTOR MANUFACTURING COMPANY LTD., Hsinchu (TW)

(72) Inventors: Felix Ying-Kit Tsui, Cupertino, CA (US); Shih-Fen Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/229,735

(22) Filed: Dec. 21, 2018

Related U.S. Application Data

(63) Continuation of application No. 15/072,906, filed on Mar. 17, 2016, now Pat. No. 10,164,005.

(51) Int. Cl.
*H01L 49/02* (2006.01)

(52) U.S. Cl.
CPC .............. *H01L 28/90* (2013.01); *H01L 28/00* (2013.01)

(58) Field of Classification Search
CPC ......... H01L 28/90; H01L 28/91; H01L 28/92; H01L 29/66181; H01L 29/945; H01L 23/5223; H01L 23/5226; H01L 23/528; H01L 23/5329
See application file for complete search history.

(56) References Cited

U.S. PATENT DOCUMENTS 10,164,005 B2 * 12/2018 Tsui ...................... H01L 28/00

* cited by examiner

*Primary Examiner* — Andrew Q Tran
(74) *Attorney, Agent, or Firm* — WPAT, P.C., Intellectual Property Attorneys; Anthony King

(57) ABSTRACT

A semiconductor structure and a method of manufacturing the same are provided. According to an embodiment, a method includes: providing a semiconductive substrate; forming a doped region in the semiconductive substrate; forming a trench in the doped region; forming a capacitor in the trench, the capacitor comprising alternatingly arranged electrodes and dielectric layers; depositing a first dielectric material in the trench and over the capacitor; etching the first dielectric material to form a spacer on a sidewall of a topmost dielectric layer of the capacitor; and depositing a core portion in the trench and laterally surrounded by the spacer.

20 Claims, 23 Drawing Sheets

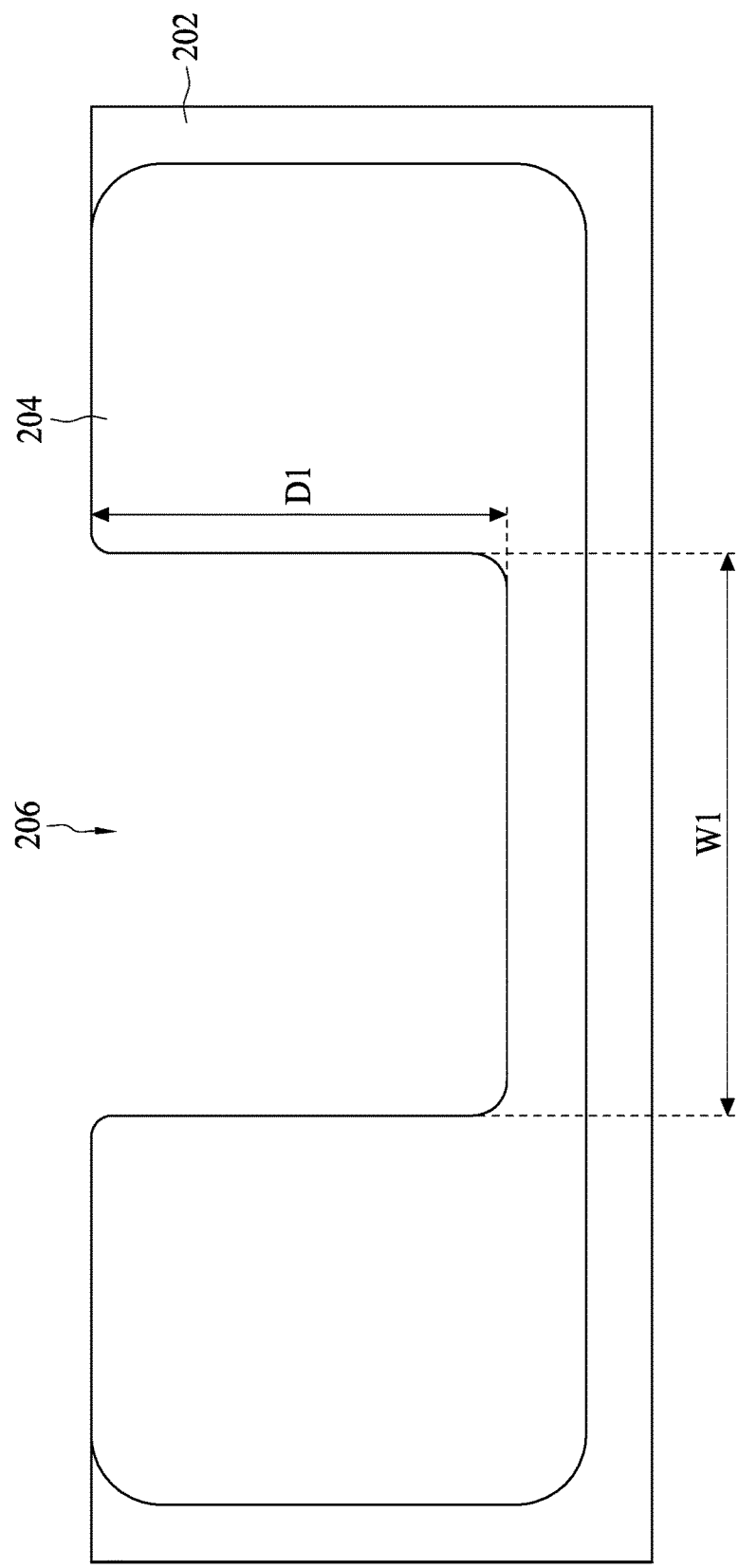

METHOD OF MANUFACTURING A DEEP TRENCH CAPACITOR WITH A FILLED TRENCH AND A DOPED REGION SERVING AS A CAPACITOR ELECTRODE

PRIORITY CLAIM AND CROSS-REFERENCE

This application is a continuation of U.S. patent application Ser. No. 15/072,906 filed Mar. 17, 2016, the disclosure of which is hereby incorporated by reference in its entirety.

BACKGROUND

Electronic equipment involving semiconductive devices are essential for many modern applications. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

In modern integrated circuit (IC) fabrication, on-chip capacitors are available for a myriad of applications, such as dynamic random access memories (DRAM), voltage controlled oscillators and operational amplifiers. The capacitors may be used for providing decoupling between circuits from undesired interference or noise resulting from the rest of the chip.

The capacitors are usually designed to possess a high aspect ratio in order to achieve a high density layout. However, as the chips are made progressively thinner, the rigidity and robustness of the wafer containing the chips may be more vulnerable to damage since the wafers along with embedded features fail to provide sufficient resistance to stress. Therefore, an improved structure and manufacturing method of capacitors are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
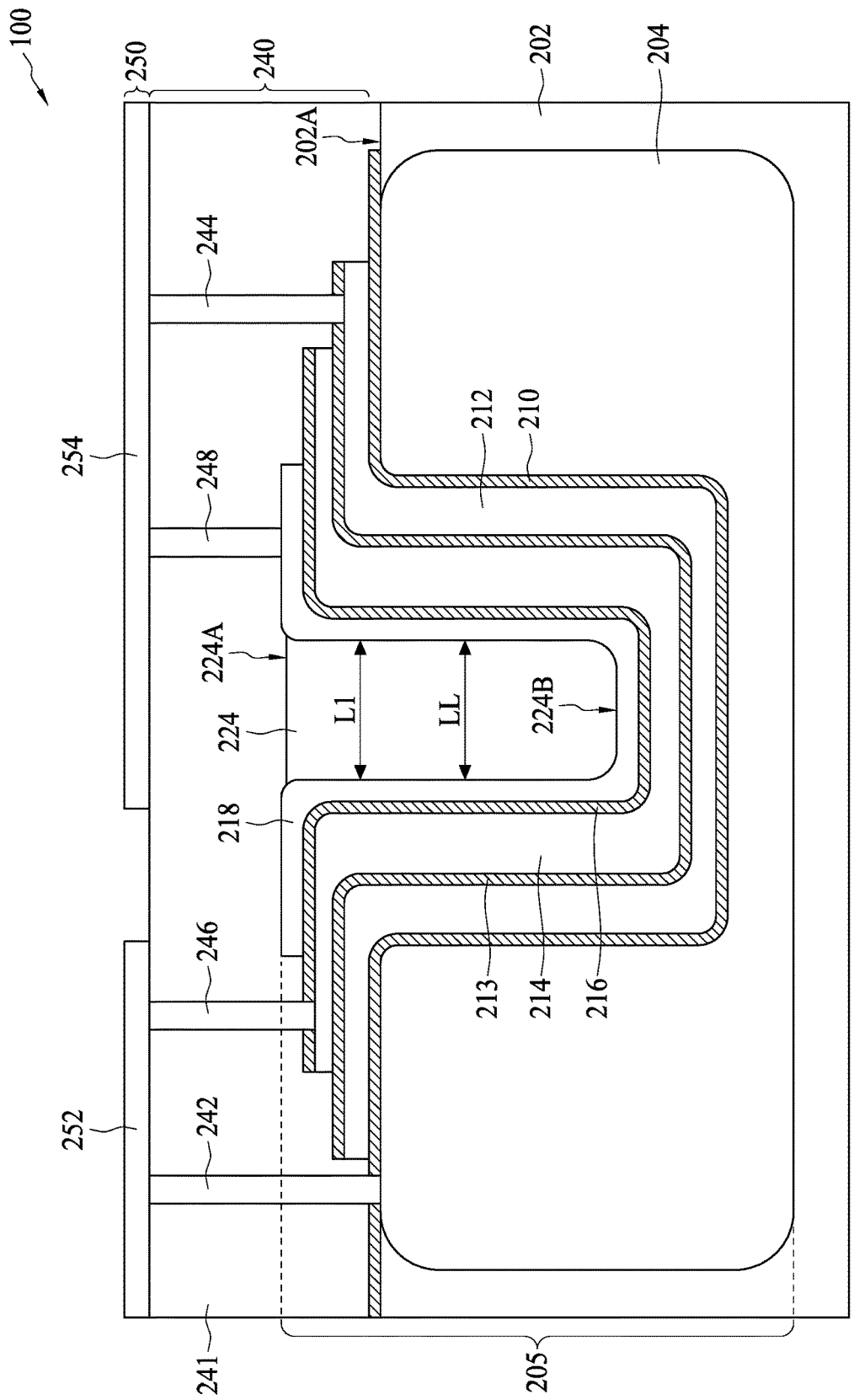
FIG. 1A is a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, the design and manufacturing of on-chip capacitors has experienced rapid progress. This includes the development of deep trench capacitors, which are common in advanced semiconductor circuits and devices. Such deep trench capacitors are usually designed to compose folded and extended electrodes and insulating dielectric materials in order to provide increased capacitance with a reduced die area. Therefore, a trench is created within the capacitor. As the capacitance requirement is increased, the ratio of the capacitor depth to the capacitor width (aka, aspect ratio) would be enlarged accordingly, and hence the created trench would be made deeper. In addition, the deeper trench would seek more space along the thickness direction of the wafer rather than the horizontal direction.

On the other hand, modern semiconductor devices have continually sought to reduce device size. In addition, the die thickness is also required to be made thinner for portable applications. For example, it is required that the wafer includes a thickness of about 30 um to about 70 um. Thus, the thinned wafer may be more fragile against stress resulting from any manufacturing or packaging process. Furthermore, process defects, such as voids or seams, may exist in manufactured semiconductor devices between contacting features or within narrow vias. The undesired voids or seams left in the semiconductor components, such as the trench in the deep trench capacitor, would undermine the supporting strength of the wafer. As a result, wafer cracking may occur. In addition, the circuit performance may deteriorate due to poor electrical characteristics of the seam.

The present disclosure discusses a deep trench capacitor structure with a filled trench. In some embodiments, there is no seam or void in the trench. The rigidity of the semiconductor wafer can be improved accordingly. Therefore, the risk of wafer cracking is effectively relieved while the wafer thinness requirement can be maintained.

FIG. 1A is a schematic view of a semiconductor structure 100, in accordance with some embodiments of the present disclosure. The semiconductor structure 100 comprises a semiconductive substrate 202, a capacitor 205, a plug 224, an interconnect structure 240 and a metal layer 250. The capacitor 205 has a doped region 204, electrodes 212, 214 and 218 and dielectrics 210, 213 and 216.

The semiconductive substrate 202 includes a semiconductor material, such as silicon. In one embodiment, the semiconductive substrate 202 may include other semiconductor materials, such as silicon germanium, silicon carbide, gallium arsenide, or the like. In the present embodiment, the semiconductive substrate 202 is a p-type semiconductive substrate (acceptor type) or n-type semiconductive substrate (donor type). Alternatively, the semiconductive substrate 202 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductive substrate 202 is a semiconductor-on-insulator (SOI). In other alternatives, the semiconductive substrate 202 may include a doped epi layer, a gradient semiconductor layer, and/or a semiconductor layer overlying another semiconductor layer of a different type, such as a silicon layer on a silicon germanium layer.

The doped region 204 is in the semiconductor 202. In some embodiments, the doped region 204 is a p-well structure, an n-well structure or a twin well structure. The doping concentration in the doped region 204 is greater than the semiconductive substrate 202. In an embodiment, the doped region 204 includes a first dopant type opposite to a second dopant type of the semiconductive substrate 202. For example, the semiconductive substrate 202 is an n-type substrate, and the doped region 204 is a p-type well. The doped region 204 is configured as an electrode of the capacitor 205. In the present embodiment, the doped region 204 disposed in the capacitor 205 is shown for illustration. Alternative arrangements, such as several adjacent capacitors sharing the doped region 204 as a common electrode thereof, are within the contemplated scope of the present disclosure.

In addition to the electrode 204, the capacitor 205 includes some electrodes 212, 214 and 218. A basic capacitor unit requires a pair of electrodes for accumulating charges. For each electrode pair, the two adjacent electrodes are spaced close yet apart and are electrically insulated to one another in order to perform charge accumulation and storage when charged. Referring to FIG. 1A, an electrode pair may be formed by a doped region, such as the doped region 204, and an electrode, such as the electrode 212. The dielectric 210 provides electrical insulation between the doped region 204 and the electrode 212.

In some embodiments, another electrode pair is formed by the electrode 212 and the electrode 214. The electrodes 212 and 214 are spaced close yet apart and are electrically insulated to each other. In some embodiments, the dielectric 213 provides electrical insulation between the electrode 212 and the electrode 214.

Moreover, in some embodiments, an electrode pair is formed by the electrode 214 and the electrode 218. The electrodes 214 and 218 are spaced close yet apart and are electrically insulated to each other. In some embodiments, the dielectric 216 provides electrical insulation between the electrode 214 and the electrode 218. In the present embodiments, the capacitor 205 provides at least three capacitor units. The numbers of electrodes and associated dielectrics are shown for illustration. Other numbers of the electrodes and accompanying dielectrics are within the contemplated scope of the present disclosure.

In some embodiments, the electrodes 212, 214 and 218 are made of semiconductive materials, such as polysilicon (polycrystalline silicon) material. In other embodiments, the electrodes 212, 214 and 218 are formed of conductive materials, such as gold, silver, copper, aluminum and tungsten or alloy thereof.

In some embodiments, the dielectrics 210, 213 and 216 are made of dielectric materials, such as high-k dielectric material. Examples of high-k dielectric materials include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof.

The capacitor 205 is disposed in a deep trench of the doped region 204 where the trench is usually formed with a high aspect ratio. Therefore, sidewalls of the electrodes 212, 214 and 218 are further extended down in the semiconductive substrate 202. The charging areas and capacitance can be increased accordingly. In addition, the thickness of the dielectric 210, 213 or 216 is designed to be relatively thin. That would save the capacitor volume and further increase the resultant capacitance. In some embodiments, the electrodes 212, 214 and 218 may be formed with the same or different materials. In some embodiments, the dielectrics 210, 213 and 216 may be formed with the same or different dielectric materials.

The interconnect structure 240 is disposed over the semiconductive substrate 202. The interconnect structure 240 is usually formed in a back-end-of-line (BEOL) operation and configured to electrically couple the capacitor 205 and other electrical components in the semiconductive substrate 202 with another layer. In some embodiments, the interconnect structure 240 electrically couples the capacitor 205 with the overlaying metal layer 250. The interconnect structure 240 may include conductive vias 242, 244, 246 and 248, and an inter-layer dielectric (ILD) 241. Contact vias 242, 244, 246 and 248 are formed in the ILD 241, and may be electrically coupled to the electrodes 204, 212, 214 and 218, respectively.

The conductive vias 242, 244, 246 and 248 may be formed of conductive materials, such as aluminum, gold, silver and tungsten. The ILD 241 may be formed from a variety of dielectric materials, such as oxide (e.g., Ge oxide), oxynitride (e.g., GaP oxynitride), silicon dioxide ($SiO_2$), nitrogen-bearing oxide (e.g., nitrogen-bearing $SiO_2$), nitrogen-doped oxide (e.g., $N_2$-implanted $SiO_2$), silicon oxynitride ($Si_xO_yN_z$), and the like.

The metal layer 250 is disposed over the interconnect structure 240. The metal layer 250 is configured to electrically connect the devices or components with other devices on the semiconductive substrate 202. The metal layer 250 may include metal lines 252 or 254 coupled to a reference power level, such as the power supply level or the ground level. The charging and discharging operations for the capacitor 205 may be performed through the metal lines 252 and 254. In some embodiments, the metal line 252 may supply the electrodes 204 and 214 with a high voltage level while the metal line 254 may connect the electrodes 212 and 218 to a low voltage level.

A plug 224 is in the capacitor 205. The plug 224 possesses a high aspect ratio. In some embodiments, the aspect ratio of the plug 224 is from about 20 to about 80. In some embodiments, the aspect ratio of the plug 224 is from about 55 to about 80. In some embodiments, the aspect ratio of the plug 224 is from about 30 to about 50.

In some embodiments, the plug 224 has parallel sidewalls from a cross-sectional view. In some embodiments, the plug 224 has tapered sidewalls from a top surface 224A to a bottom surface 224B. The plug 224 has a width LL measured from any locations of the sidewall thereof. In some embodiments, the width L1 measured from the top surface 224A is greater than the width LL measured from any other locations away from the top surface 224A.

In some embodiments, the plug 224 is conductive or semiconductive. The plug 224 is configured as an extension of the electrode 218, and thus regarded as a portion of the capacitor 205. In some embodiments, the plug 224 is made of a same material as the electrode 218.

In some embodiments, the electrodes 212, 214 and 218 are extended along a horizontal direction parallel to the top surface 202A of the semiconductive substrate 202. Moreover, the conductive vias of the interconnect structure 240 are spaced apart from the top surface 224A of the plug 224. Such arrangement provides sufficient space for coupling of the electrodes to corresponding conductive vias. In some embodiments, an offset between the plug 224 and a nearest conductive via is from about 0.05 um to about 0.3 um. In some embodiments, an offset between the plug 224 and a nearest conductive via is from about 0.5 um to about 3 um. In some embodiments, an offset between the plug 224 and a nearest conductive via is from about 0.5 um to about 1 um. The top surface 224A is defined as the surface exposed from the electrode 218. The top surface 224A is also the surface interfacing with inter layer dielectric (ILD) 241. In some embodiments, an offset between the plug 224 and a nearest conductive via is from about 0.1*L1 to about 2*L1. In some embodiments, an offset between the plug 224 and a nearest conductive via is from about 0.1*L1 to about L1. In some embodiments, an offset between the plug 224 and a nearest conductive via is from about 0.1*L1 to about 0.5*L1.

In some embodiments, the plug 224 may be electrically insulated from the capacitor 205. For example, the plug 224 may be electrically insulated from the electrode 218, 214 or 212 or the doped region 204. In some embodiments, the plug may be made of a material different from that of the electrode 218. For example, the plug 224 comprises a dielectric or polysilicon material. In some embodiments, the plug may comprise a conductive material, such as copper, aluminum, gold, silver or tungsten.

Figure 1B:
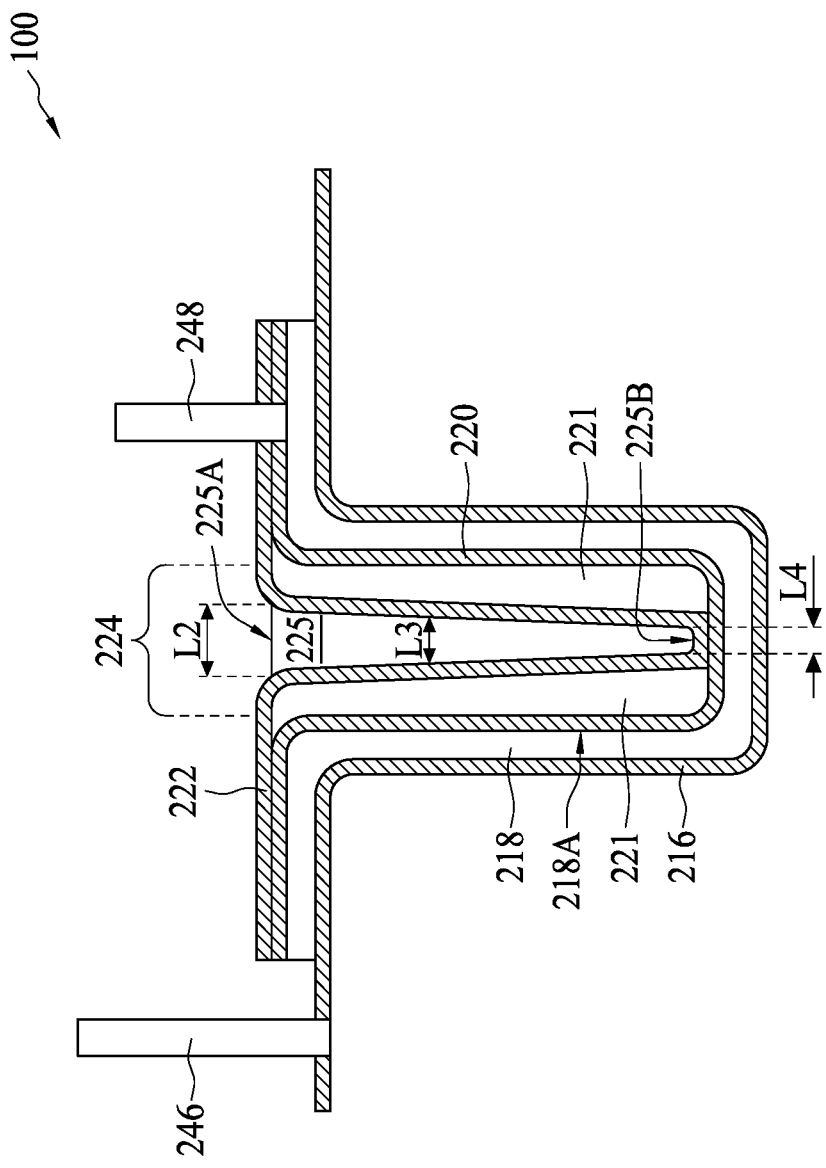
FIG. 1B is a schematic view of a semiconductor structure in accordance with some embodiments of the present disclosure.

FIG. 1B is an enlarged schematic view of the semiconductor structure 100 of FIG. 1A, in accordance with some embodiments of the present disclosure. Specifically, the structure of the plug 224 and its neighboring features are illustrated in FIG. 1B. The shapes and materials of the plug 224 may be determined according to different scenarios. For example, the plug 224 may include a multi-layer structure. Alternatively, the plug 224 may include a different shape from a cross-sectional view.

Referring to FIG. 1B, the plug 224 includes a spacer 221 and a core portion 225. The spacer 221 is formed over a bottom surface of the electrode 218. In some embodiments, at least a portion of the spacer 221 is disposed between the core portion 225 and the electrode 218. In some embodiments, the spacer 221 is substantially lining along a sidewall 218A of the electrode 218.

In some embodiments, the spacer 221 is formed to surround the core portion 225. The resultant trench to be filled by the core portion 225 is narrowed from its bottom. In some embodiments, the core portion 225 may possess a tapered shape from a cross-sectional view. The area of a top surface 225A is greater than that of a bottom surface 225B.

The top surface 225A of the core portion 225 is in contact with an element external to the capacitor 205. In the present embodiment, referring to FIGS. 1A and 1B, the top surface 225A is in contact with the interconnect structure 240. The bottom surface 225B is in contact with the dielectric 222. The bottom surface 225B has a width L4. In addition, the core portion 225 may possess a lateral width L3 at a location between the top surface 225A and the bottom surface 225B. In some embodiments, the top surface 225A has a width L2, which is greater than the width L4. In some embodiments, the width L2 is greater than the width L3. In some embodiments, the width L3 is greater than the width L4. In the present embodiment, the core portion 225 is regarded as another plug surrounded and defined by the spacer 221.

In an existing deep trench capacitor, the trench created after the formation of the uppermost electrode 218 often includes a lateral width uniformly distributed across sidewalls of the electrode 218. As such, during the formation operation of the plug 224, a deposited overhang portion grown at the top corners of the trench may cause the opening at the top surface of the plug 224 to close before the interior of the plug 224 is fully deposited. To the contrary, the present disclosure disposes the spacer 221 before the formation of the core portion 225. Therefore, the spacer 221 can enhance the filling performance of the tapered core portion 225. Consequently, a void-free or seam-free deep trench capacitor can be achieved.

In some embodiments, the spacer 221 may be formed of a variety of materials, for example oxide (e.g., Ge oxide), nitride, oxynitride (e.g., GaP oxynitride), silicon dioxide ($SiO_2$), nitrogen-bearing oxide (e.g., nitrogen-bearing $SiO_2$), nitrogen-doped oxide (e.g., $N_2$-implanted $SiO_2$), silicon oxynitride (SixOyNz), tetraethyl orthosilicate (TEOS), and the like.

In some embodiments, a dielectric 220 is formed between the spacer 221 and the electrode 218. The dielectric 220 may be formed of a variety of materials, for example oxide (e.g., Ge oxide), oxynitride (e.g., GaP oxynitride), silicon dioxide ($SiO_2$), nitrogen-bearing oxide (e.g., nitrogen-bearing $SiO_2$), nitrogen-doped oxide (e.g., $N_2$-implanted $SiO_2$), silicon oxynitride (SixOyNz), tetraethyl orthosilicate (TEOS), and the like.

Similarly, in some embodiments, a dielectric 222 is formed between the spacer 221 and the core portion 225. The dielectrics 220 and 222 may be extending along the top surface of the electrode 218. In some embodiments, the spacer 221 has a top level equal to the top surface of the electrode 218, or a top surface of the dielectric 220 in case the dielectric 220 is present. The dielectric 222 may be formed of a variety of materials, such as oxide (e.g., Ge oxide), oxynitride (e.g., GaP oxynitride), silicon dioxide ($SiO_2$), nitrogen-bearing oxide (e.g., nitrogen-bearing $SiO_2$), nitrogen-doped oxide (e.g., $N_2$-implanted $SiO_2$), silicon oxynitride (SixOyNz), tetraethyl orthosilicate (TEOS) and the like.

Figure 1C:
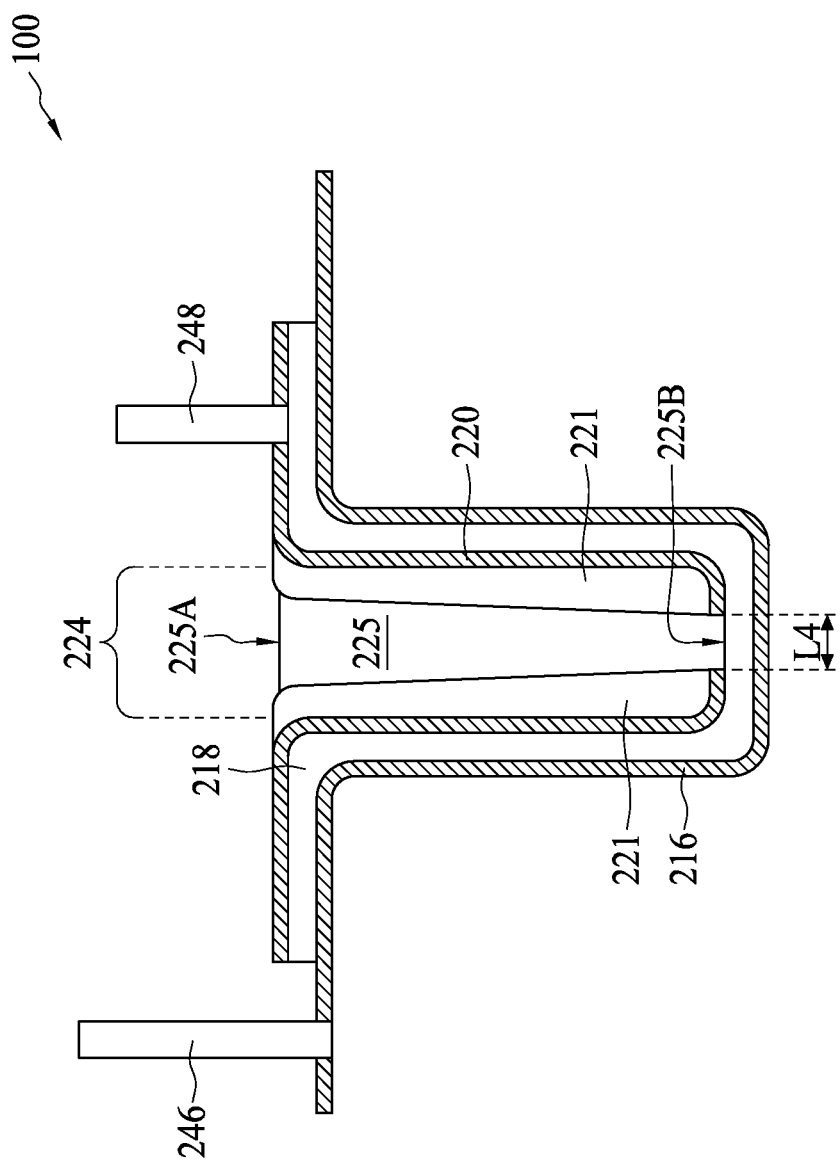
FIG. 1C is a schematic view of a semiconductor structure in accordance with some embodiments of the present disclosure.

FIG. 1C is another enlarged schematic view of the semiconductor structure 100 of FIG. 1A, in accordance with some embodiments of the present disclosure. The core portion 225 may be in contact with the electrode 218. In some embodiments, the core portion 225 may be in an electrical connection with the electrode 218. For example, referring to FIG. 1C, at least a portion of the dielectric 220 at the bottom surface 225B of the core portion 225 is removed. Therefore, the core portion 225 is in contact with the electrode 218 and the bottom surface 225B is at an interface between the core portion 225 and the electrode 218. In the present embodiment, the core portion 225 is regarded as yet another plug surrounded and defined by the spacer 221 and the electrode 218.

In some embodiments, the dielectric 220 has an opening through which the electrode 218 is in physical or electrical connection with the core portion 225. The opening has a width similar to the width L4 of the bottom surface 224B for the core portion 225. In some embodiments, the top surface 225A of the core portion 225 is greater than the width L4 of the opening for the dielectric 220.

In some embodiments, the core portion is configured to electrically couple to the electrode 218. In some embodiments, the core portion 225 includes the same material as the electrode 218, such as polysilicon. In some embodiments, the core portion 225 may include a conductive material, such as copper, aluminum or tungsten. The semiconductive or conductive material used for the core portion 225 electrically coupling the electrode 218 through the opening of the dielectric 220 may enable the plug 224 to act as an extension of the electrode 218 and function in a similar way to the electrode 218.

Figure 2A:
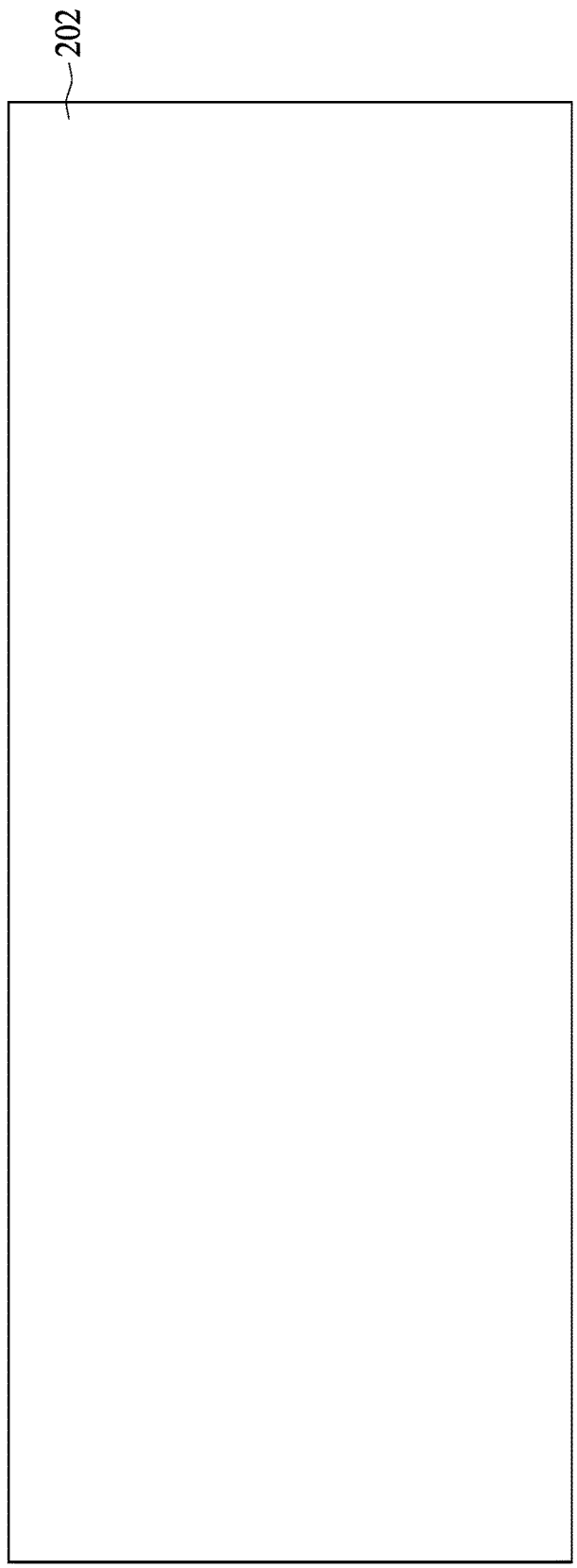
FIGS. 2A-2T are schematic views of manufacturing a semiconductor structure in accordance with some embodiments of the present disclosure.
Figure 2B:
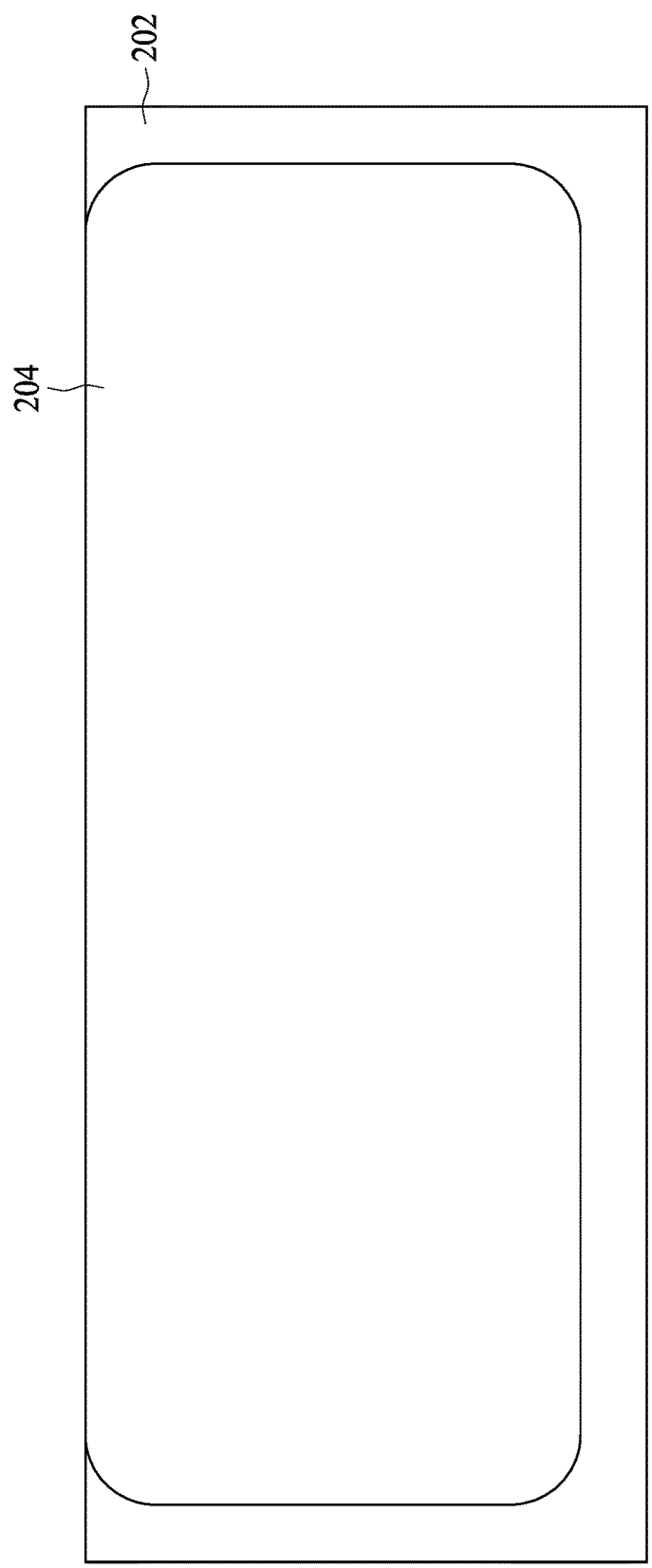
Figure 2D:
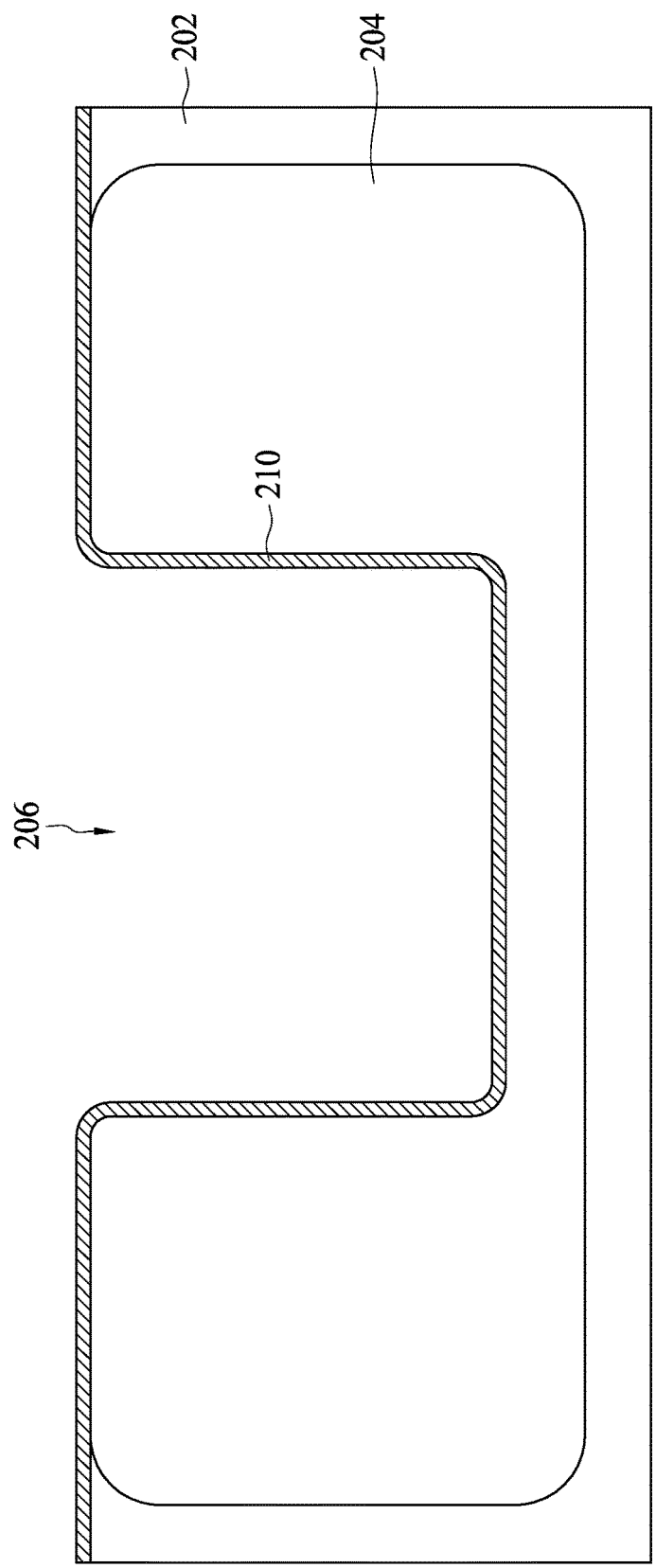
Figure 2E:
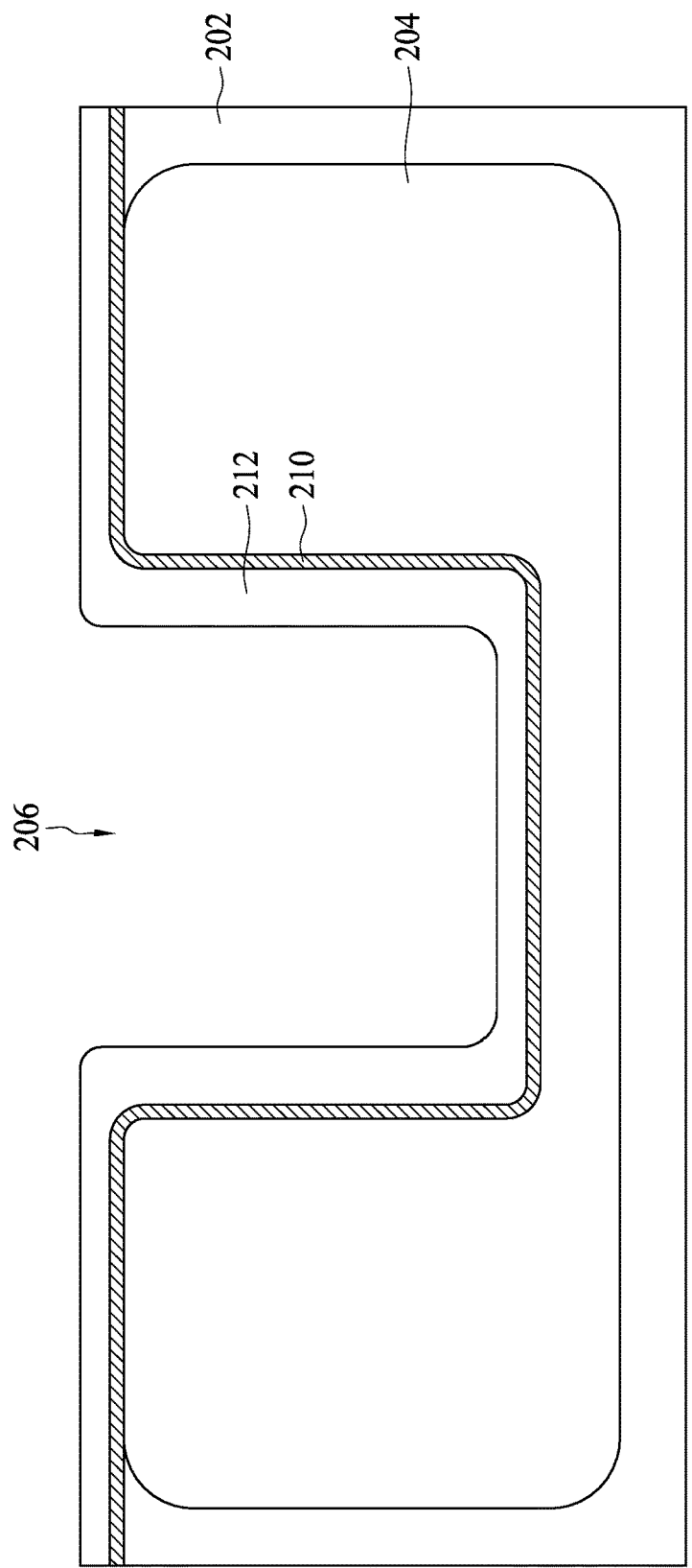
Figure 2F:
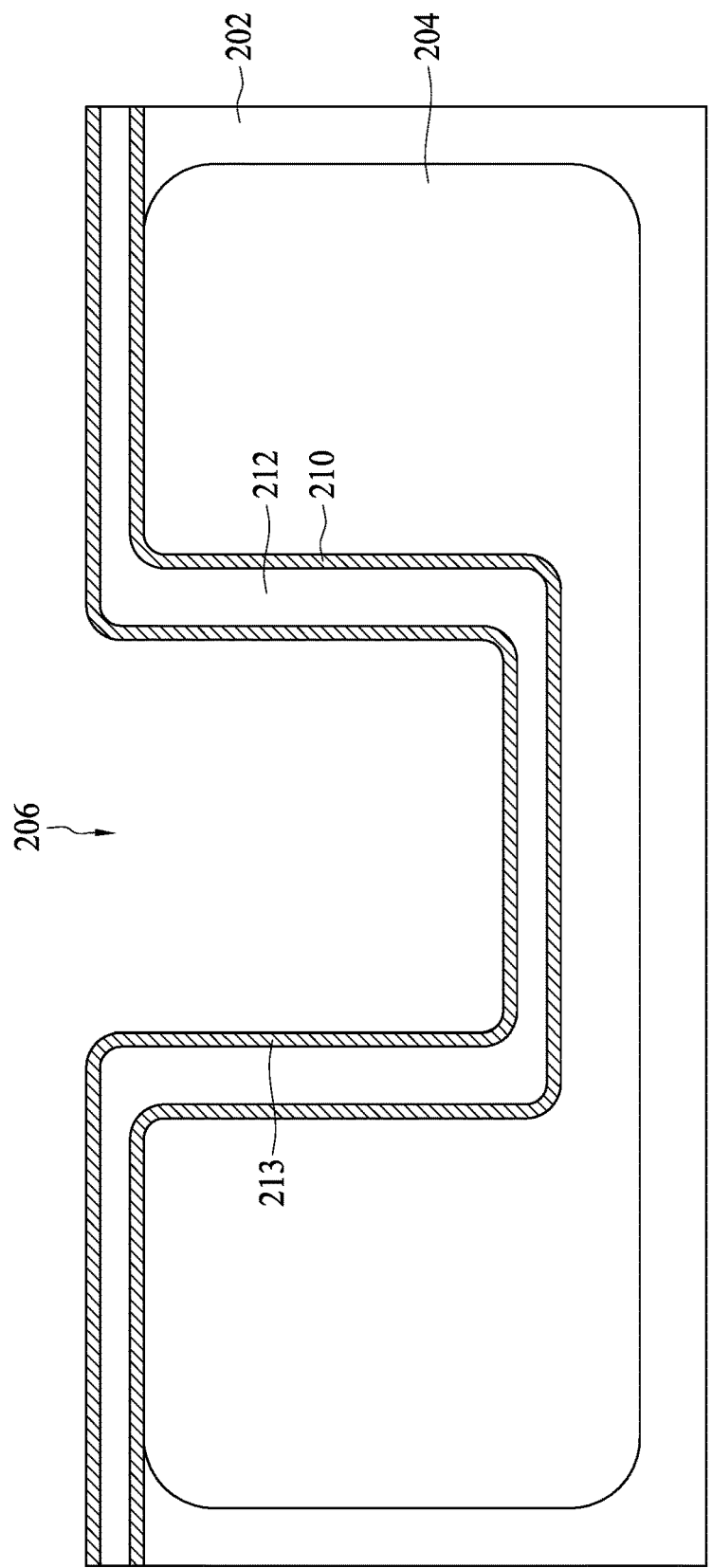
Figure 2G:
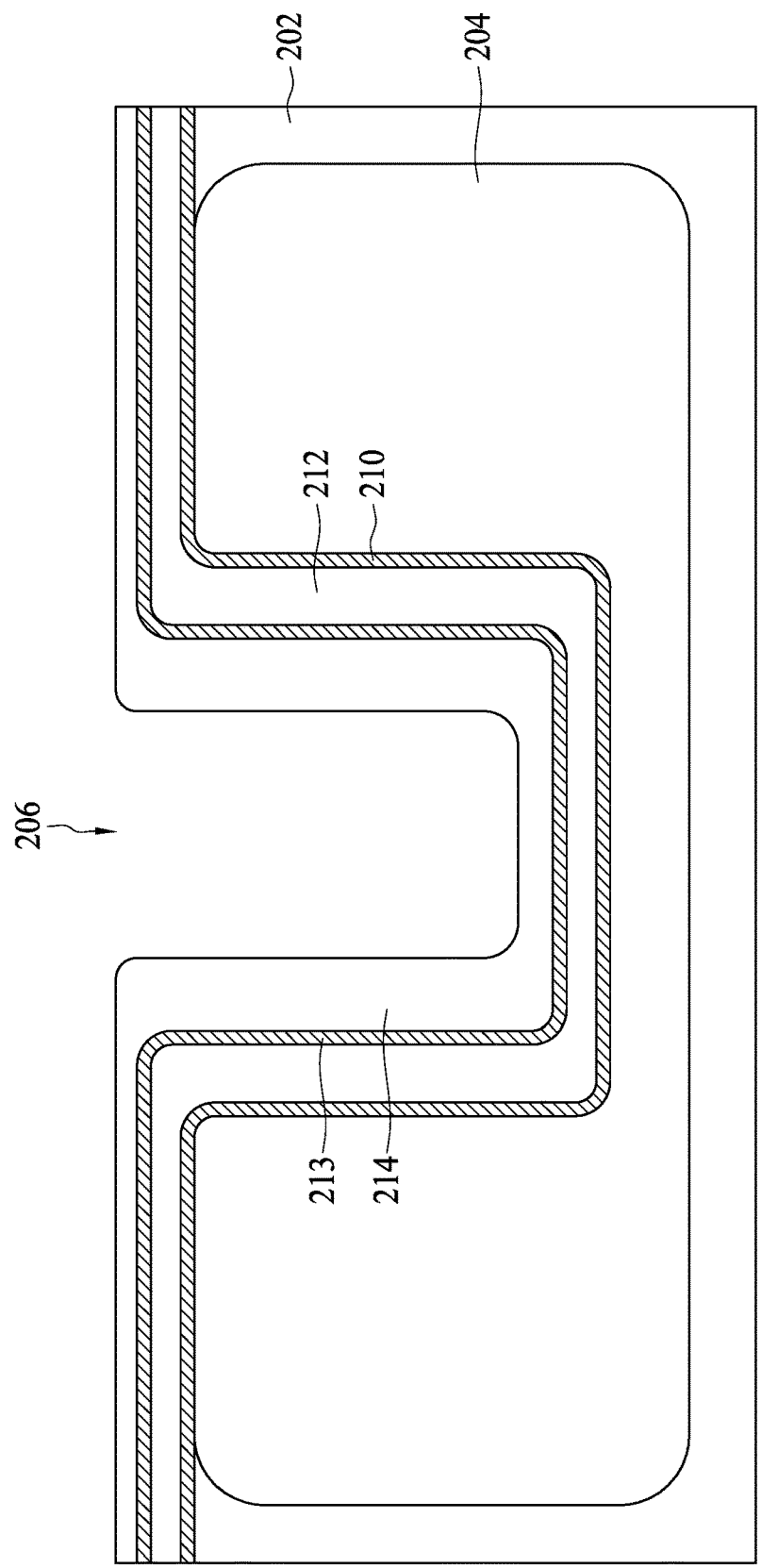
Figure 2H:
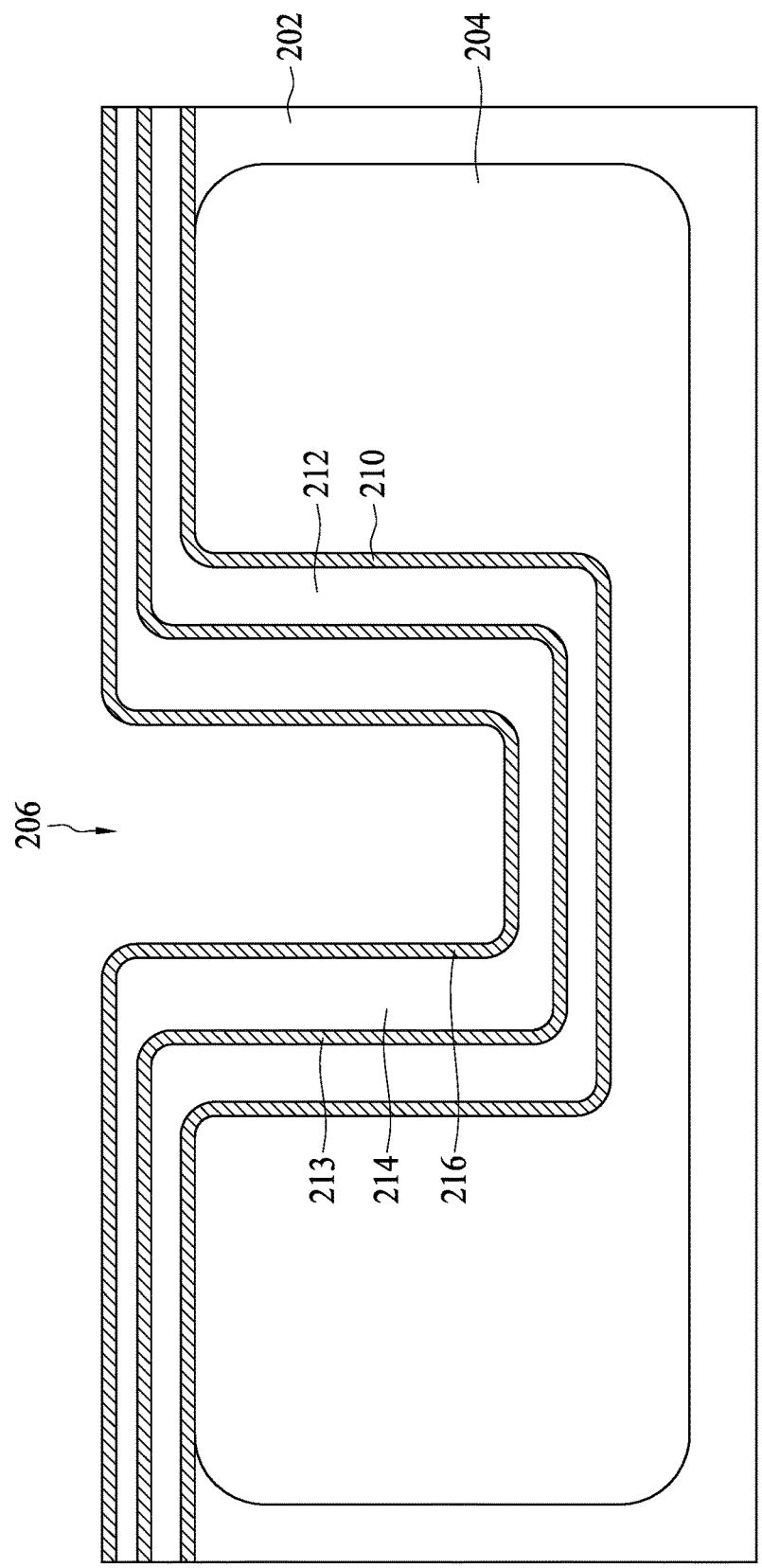
Figure 2I:
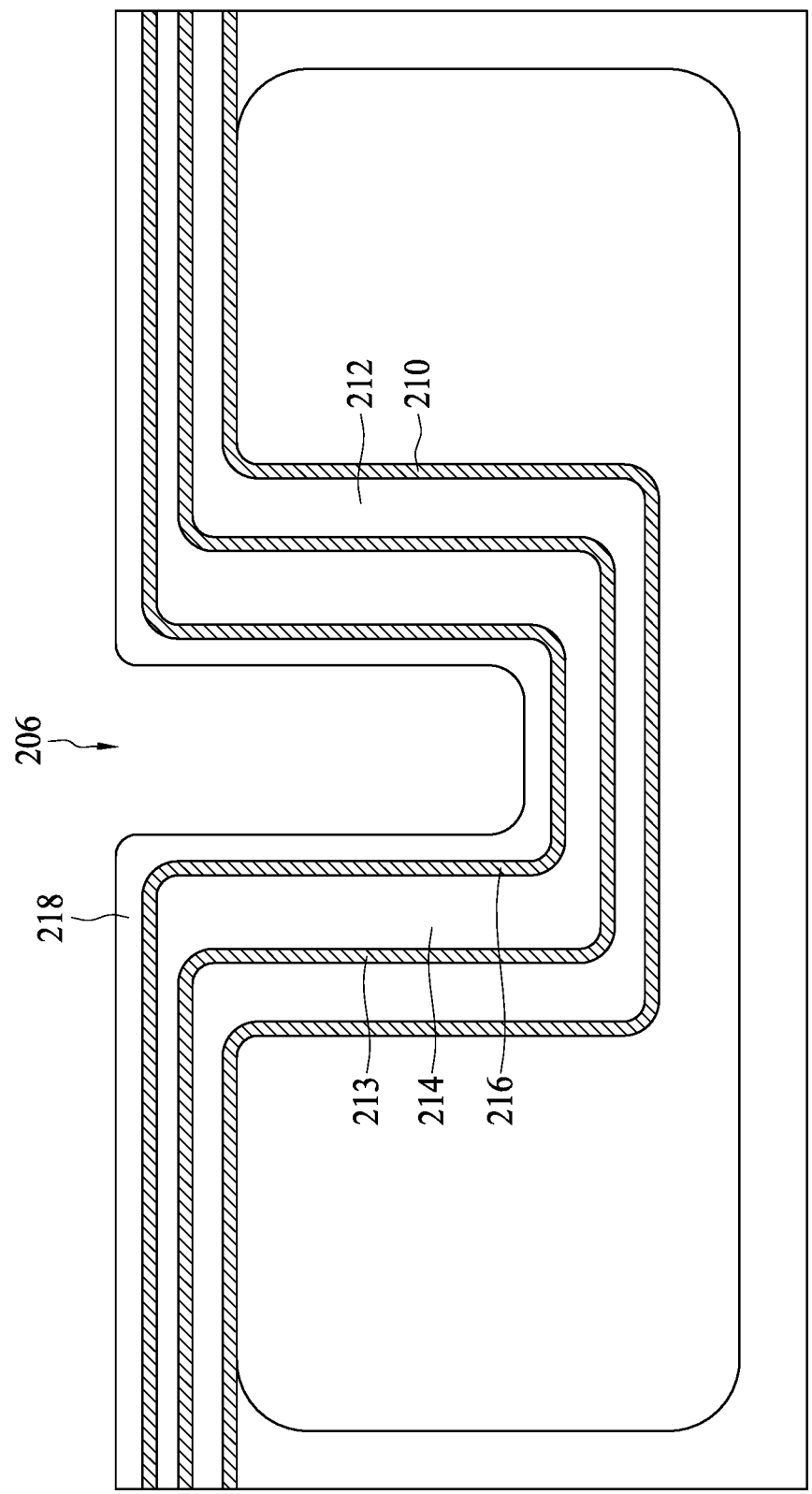
Figure 2J:
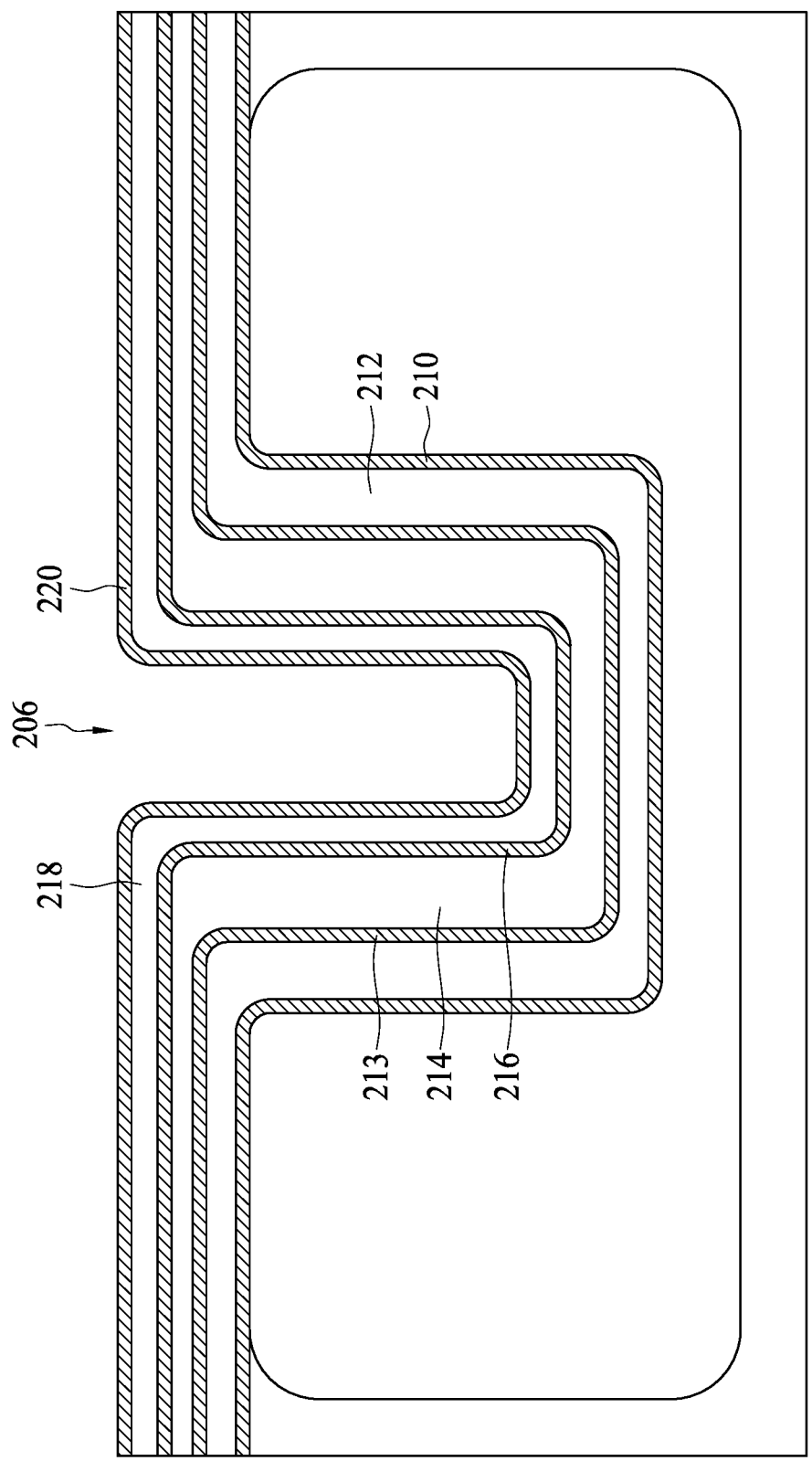
Figure 2K:
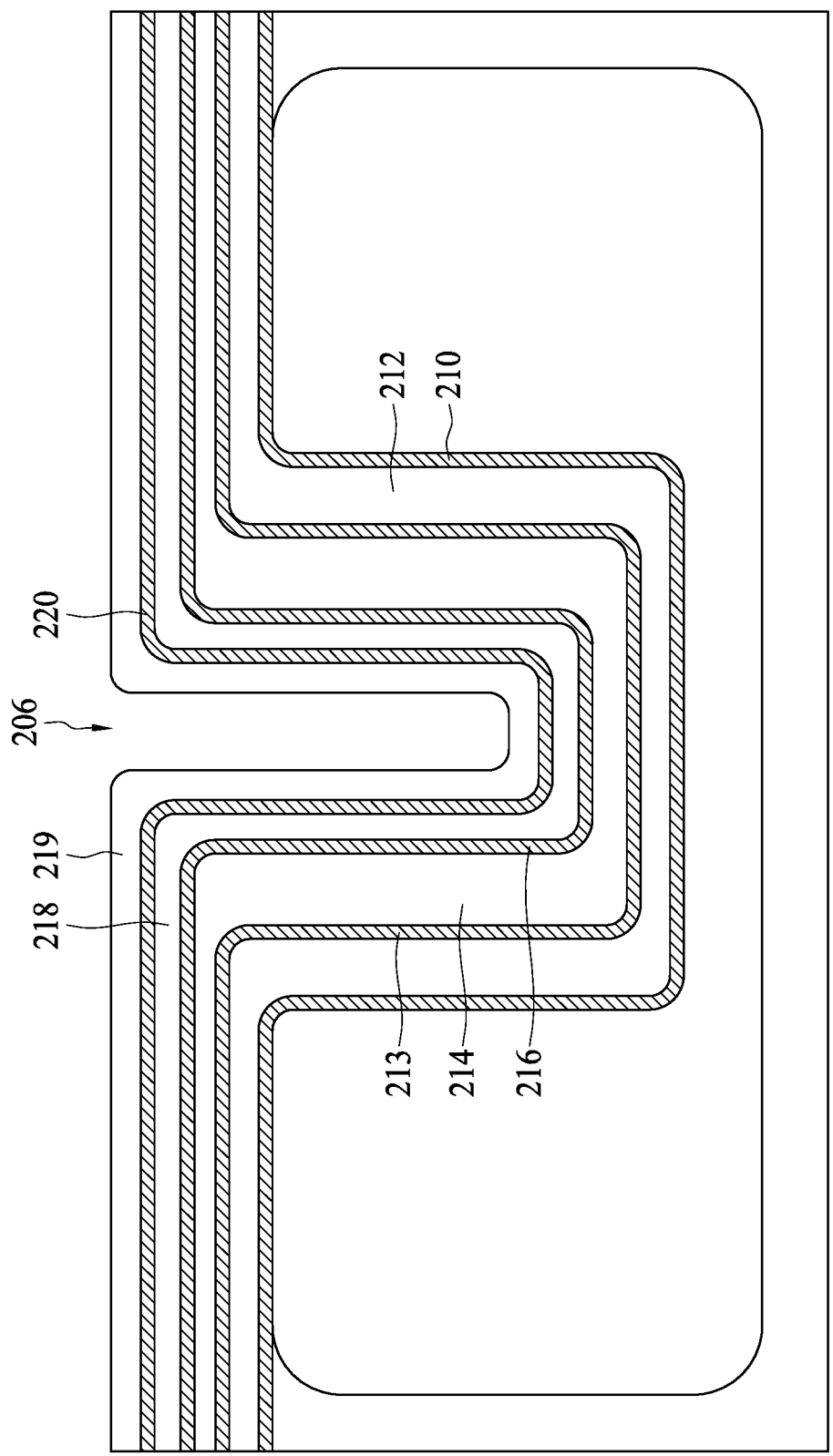
Figure 2L:
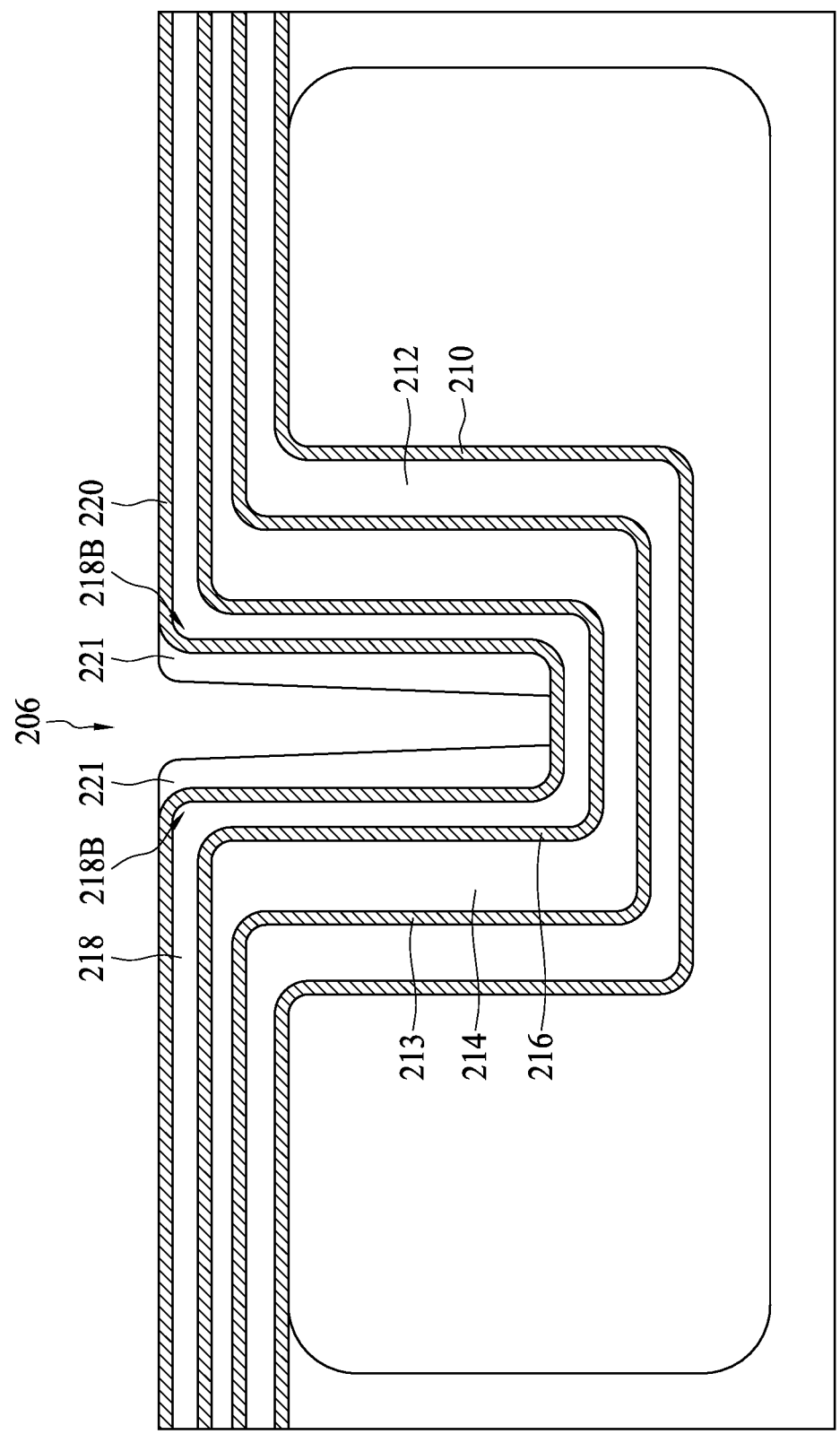
Figure 2M:
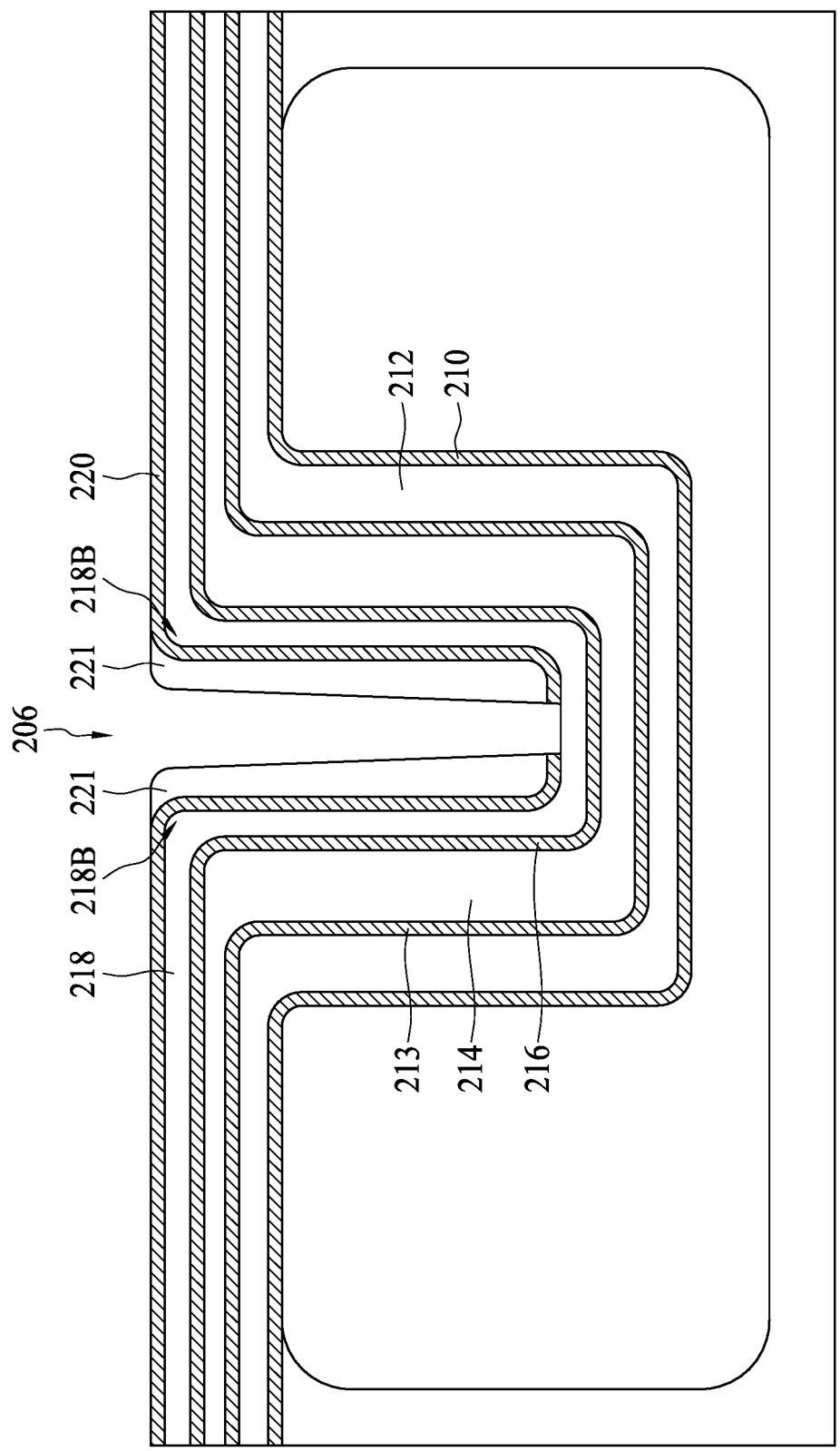
Figure 2N:
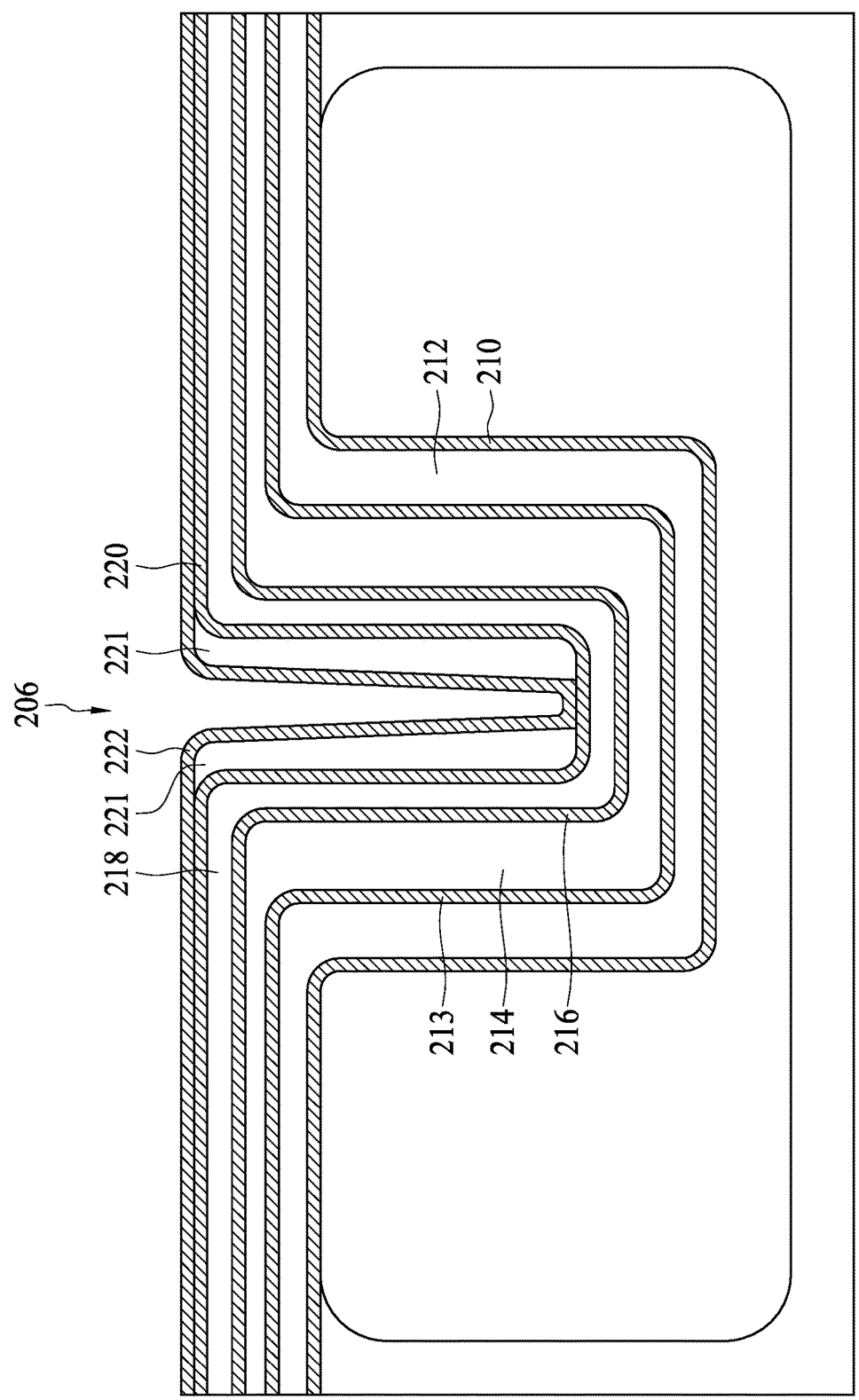
Figure 2O:
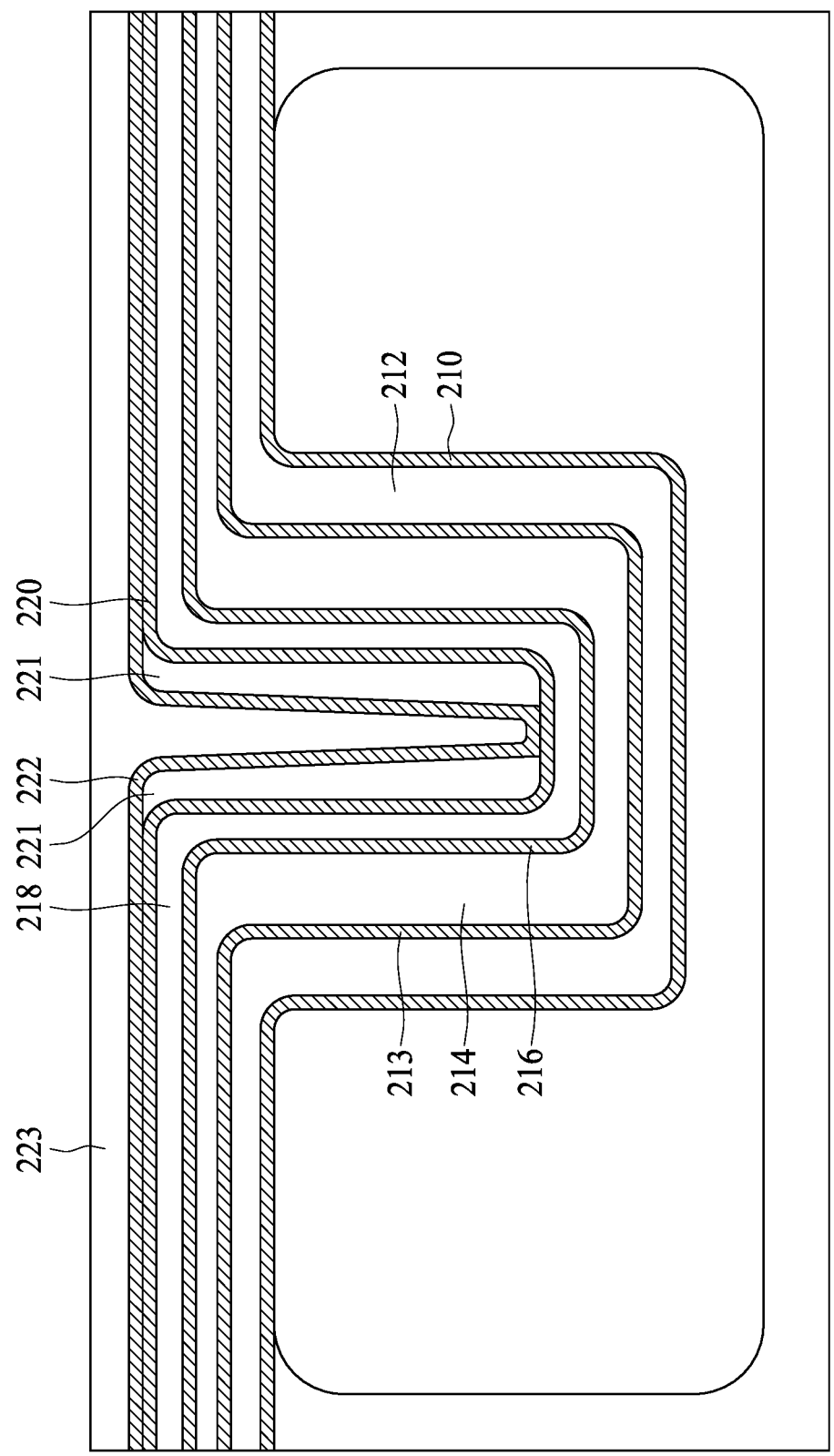
Figure 2P:
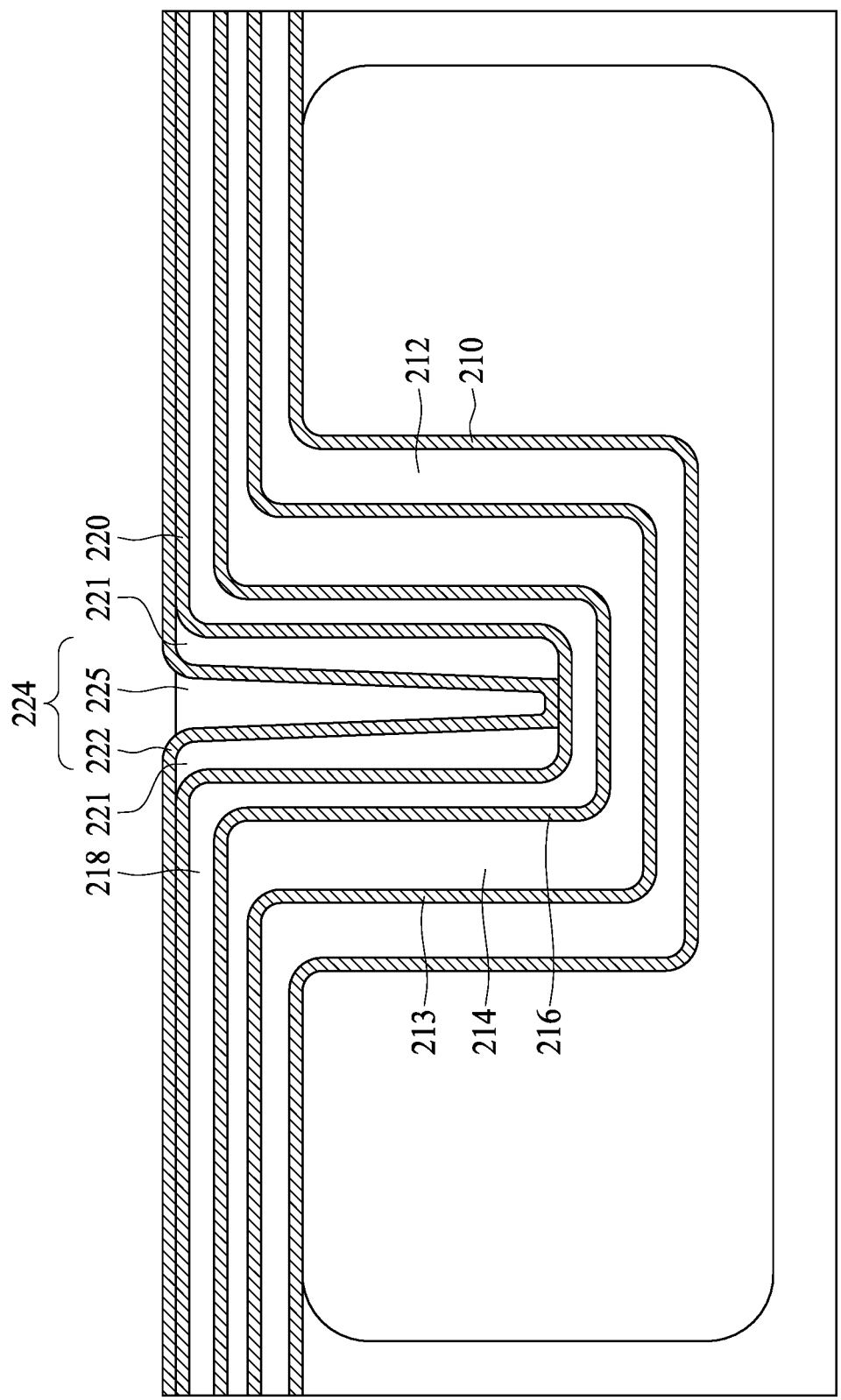
Figure 2Q:
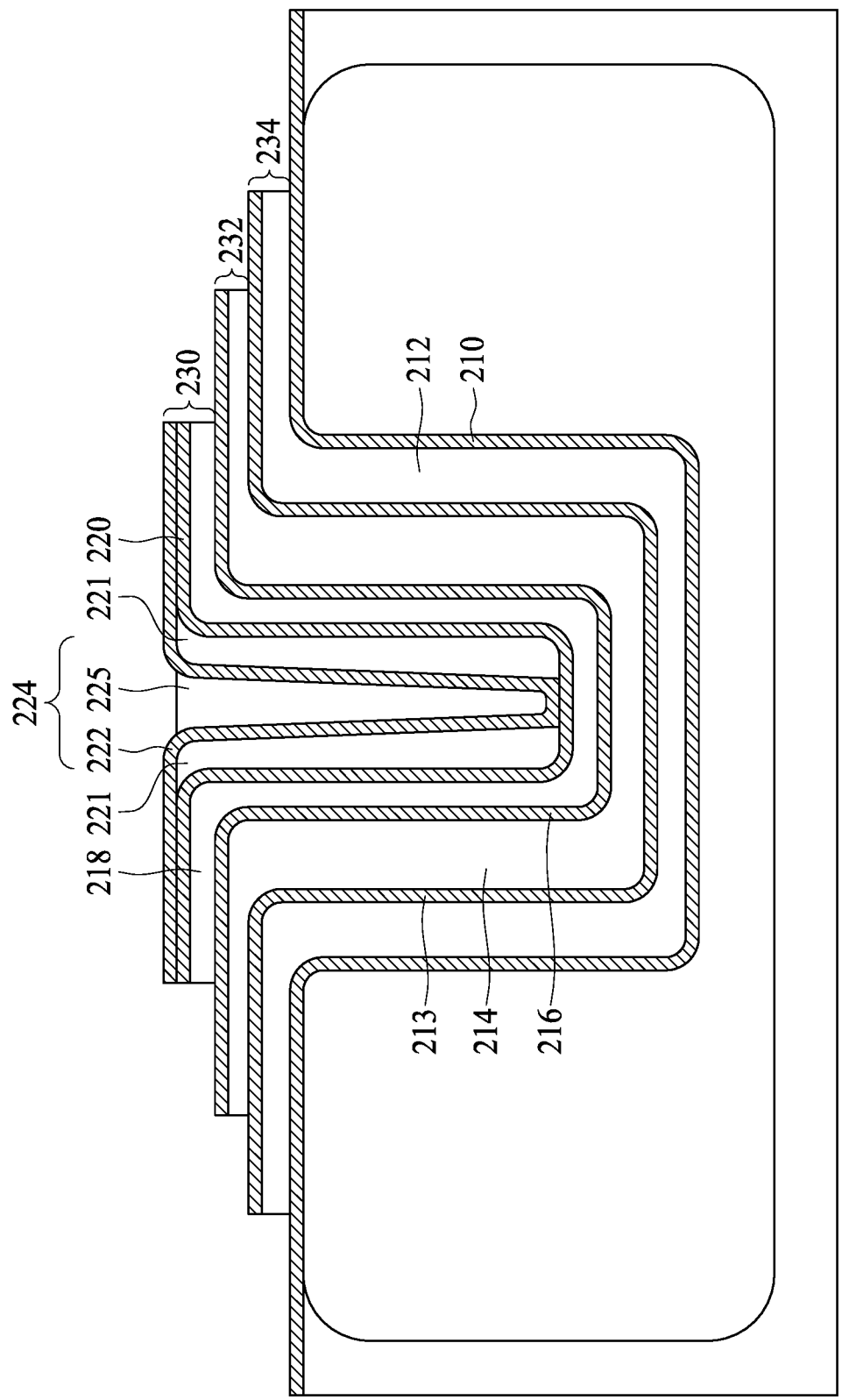

FIG. 2A to FIG. 2Q show cross-sectional views of the semiconductor structure 100 of FIG. 1A fabricated at various stages, in accordance with some embodiments of the present disclosure. In FIG. 2A, the semiconductive substrate 202 is provided. In some embodiments, at least one transistor structure (not shown) may be formed in the semiconductive substrate 202. The semiconductive substrate 202 has a first dopant type, such as a P-type.

Referring to FIG. 2B, a doped region 204 is formed in the semiconductive substrate 202. The doped region 204 has a second doping type that is opposite to the first doping type, for example an N-type dopant. The doped region 204 may be formed with a doping concentration higher than the semiconductive substrate 202. In some embodiments, the doping concentration has a range from about 1E19 $cm^{-3}$ to about 1E21 $cm^{-3}$. In some embodiments, the doping concentration has a range from about 1E19 $cm^{-3}$ to about 1E20 $cm^{-3}$. In some embodiments, the doping concentration has a range from about 1E20 $cm^{-3}$ to about 1E21 $cm^{-3}$. In some embodiments, the doped region 204 is formed by depositing a mask layer (not separately shown) on the semiconductive substrate 202. The mask layer is patterned through an etching operation to form desired openings for the doped region 204. Then, dopants are supplied to the patterned semiconductive substrate 202 through an ion implantation operation. The mask layer is configured to pass the ions through the exposed openings. The doped region 204 is formed accordingly while dopants are blocked from diffusing into the remaining portion of the semiconductive substrate 202. In some embodiments, the doped region 204 may be formed by a suitable process such as a POCl3 doping method or other doping methods.

Referring to FIG. 2C, a trench 206 is formed in the doped region 204. In some embodiments, the trench 206 has a width W1 and a depth D1, and the aspect ratio of the depth D1 to the width W1 is approximately from about 30 to about 1000. For example, the trench 206 can be approximately 1.2 um wide and approximately 36 um deep. The trench 206 is formed where a trench mask (not shown) is disposed over the doped region 204. The trench mask can be a photoresist mask or hard mask, such as nitride. Then, an etching operation is performed with the trench mask in place. The trench 206 is formed by a suitable etching process, such as a dry etch operation. In some embodiments, the dry etch in the present operation includes a reactive ion etch (RIE) adopting fluorine-containing gases. The trench mask is removed after the trench 206 is completed. In some embodiments, the order of operations in FIG. 2B and FIG. 2C can be interchanged.

FIG. 2D through FIG. 2I show the formation of the remaining portions of the capacitor 205. The capacitor 205 is formed of a stacked structure composing interlaced dielectrics and electrodes. In the present embodiment, the dielectric 210 is blanket deposited over the doped region 204 and a portion of the semiconductive substrate 202, as shown in FIG. 2D. The dielectric 210 may be formed by a variety of techniques, e.g., high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

In FIG. 2E, the electrode 212 is conformally formed over the dielectric 210. In some embodiments, the electrode 212 partially surrounds the dielectric 210 from sidewalls thereof. The electrode 212 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

In some embodiments, the dielectric 213, the electrode 214, the dielectric 216 and the electrode 218 are formed over one another in sequence with reference to FIG. 2F through FIG. 2I, respectively. In addition, each of the dielectrics 213 and 216 and the electrodes 214 and 218 extends over a top surface of the semiconductive substrate 202. Moreover, each of the underlying layers of the aforesaid dielectrics and electrodes partially surrounds an overlying layer from sidewalls thereof. The dielectric 213, the electrode 214, the dielectric 216 and the electrode 218 may be formed by a variety of techniques, e.g., high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Referring to FIG. 2J, in some embodiments, the dielectric 220 is conformally deposited over the electrode 218. The dielectric 220 may include a dielectric material such as tetraethyl orthosilicate (TEOS) and is formed by a variety of techniques, e.g., high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

In FIG. 2K, a dielectric material 219 is blanket deposited over the capacitor 205 and fills the trench 206. However, due to the geometry of the high aspect ratio of the capacitor 205, a void or seam may be present in the trench 206. Therefore, an etching process is performed with reference to FIG. 2L to etch back the dielectric material 219 for forming the spacer 221. This process can be performed by a plasma etch operation, such as an Inductively Coupled Plasma (ICP) etch where the etch is stopped at the dielectric 220. In some embodiments, after the etch back operation, excess portions of the dielectric material 219 exposed outside the trench 206 are removed from the top surface of the dielectric 220 using a chemical mechanical polishing (CMP) operation. At the same time, the trench 206 is modified to include a tapered sidewall from a top surface to a bottom surface taken from a cross-sectional view.

In some embodiments, before the formation of the dielectric 220 and the spacer 221, another etch operation is performed to trim the upper corner portions 218B of the electrode 218. Thus, a width at the top surface of the trench 206 (and also the width of the later formed core portion 225) would be larger than a bottom surface of the trench 206.

In some embodiments, as shown in FIG. 2M, the etching operation forming the spacer 221 further creates an opening at a bottom of the dielectric 220 and stops at the electrode 218. Such etch exposes a portion of the electrode 218 to the trench 206 and enables an electrical connection between the to-be-formed core portion 225 and the electrode 218. The profile of the spacer 221 and the width of the opening of the dielectric 220 can be controlled by the etching operation.

The operations of FIG. 2L and FIG. 2M may enhance the filling of the core portion 225 without causing an undesired void or seam in the interior of the trench 206 during the deposition operation which forms the plug 224. In some embodiments, the plug 224 may be formed with the help of the trimming operation for the corners 218B of the electrode 218 alone (deposition of the dielectric 220 may still be required) in the absence of the spacer 221.

In some embodiments, in FIG. 2N, the dielectric 222 may be conformally deposited on a sidewall of the spacer 221 and a portion of the dielectric 220 at its bottom, and over a portion of the top surface of the dielectric 220. The dielectric 222 may be formed by a variety of techniques, e.g., high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Referring to FIG. 2O, the core portion 225 is blanket deposited over the dielectric 222 and the trench 206. The core portion 225 covers the top surface of the dielectric 222 and fills the trench 206. The deposition operation may be performed by a plasma deposition process, such as physical vapor deposition (PVD) or chemical vapor deposition (CVD), including plasma enhanced chemical vapor deposition (PECVD). In some embodiments, the deposition may be conducted through a plating process for filling conductive materials. In some embodiments, as shown in FIG. 2P, the deposition process is followed by planarization of the core portion 225, such as by chemical mechanical polishing (CMP), to remove residues on the top surface of the dielectric 222. In some embodiments, the top surface of the core portion 225 may be equal to or lower than the planarized top surface of the dielectric 222.

FIG. 2Q shows the formation of patterned electrode regions 230, 232 and 234, in accordance with some embodiments of the present disclosure. A photoresist layer (not shown) is patterned over the stacked structure of the capacitor 205 to expose the patterned electrode region 230. The patterned electrode region 230 is formed by a suitable etching operation, such as a dry etch operation, to remove undesired portions of the electrode layer 218 and dielectrics 220 and 222. In some embodiments, the dry etch in the present operation includes a reactive ion etch (RIE) adopting fluorine-containing gases. In some embodiments, the patterned electrode regions 232 and 234 are formed in sequence where the patterned electrode region 232 includes the electrode 214 and the dielectric 216, and the patterned electrode region 234 includes the electrode 212 and the dielectric 213.

Figure 2R:
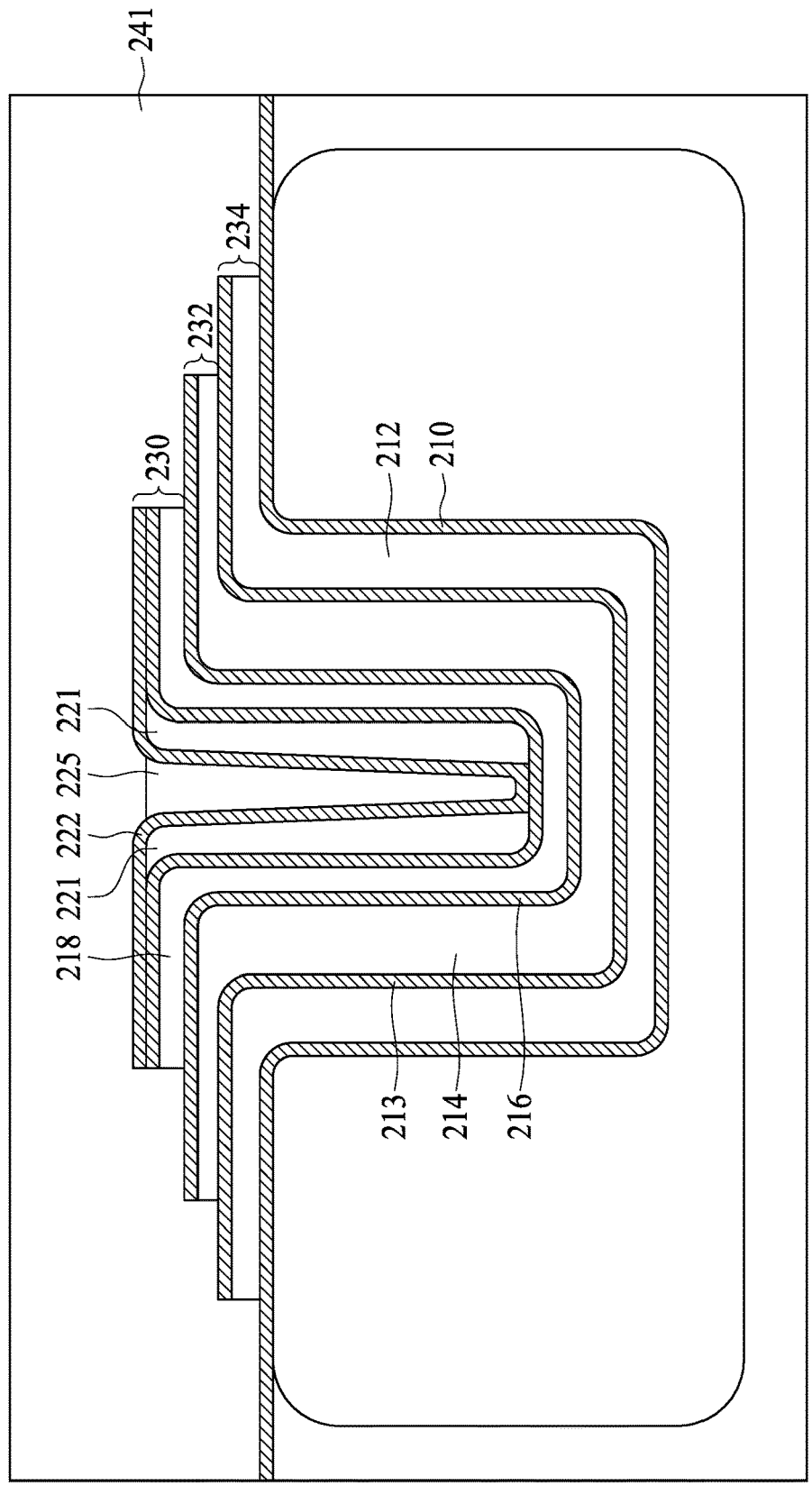
Figure 2S:
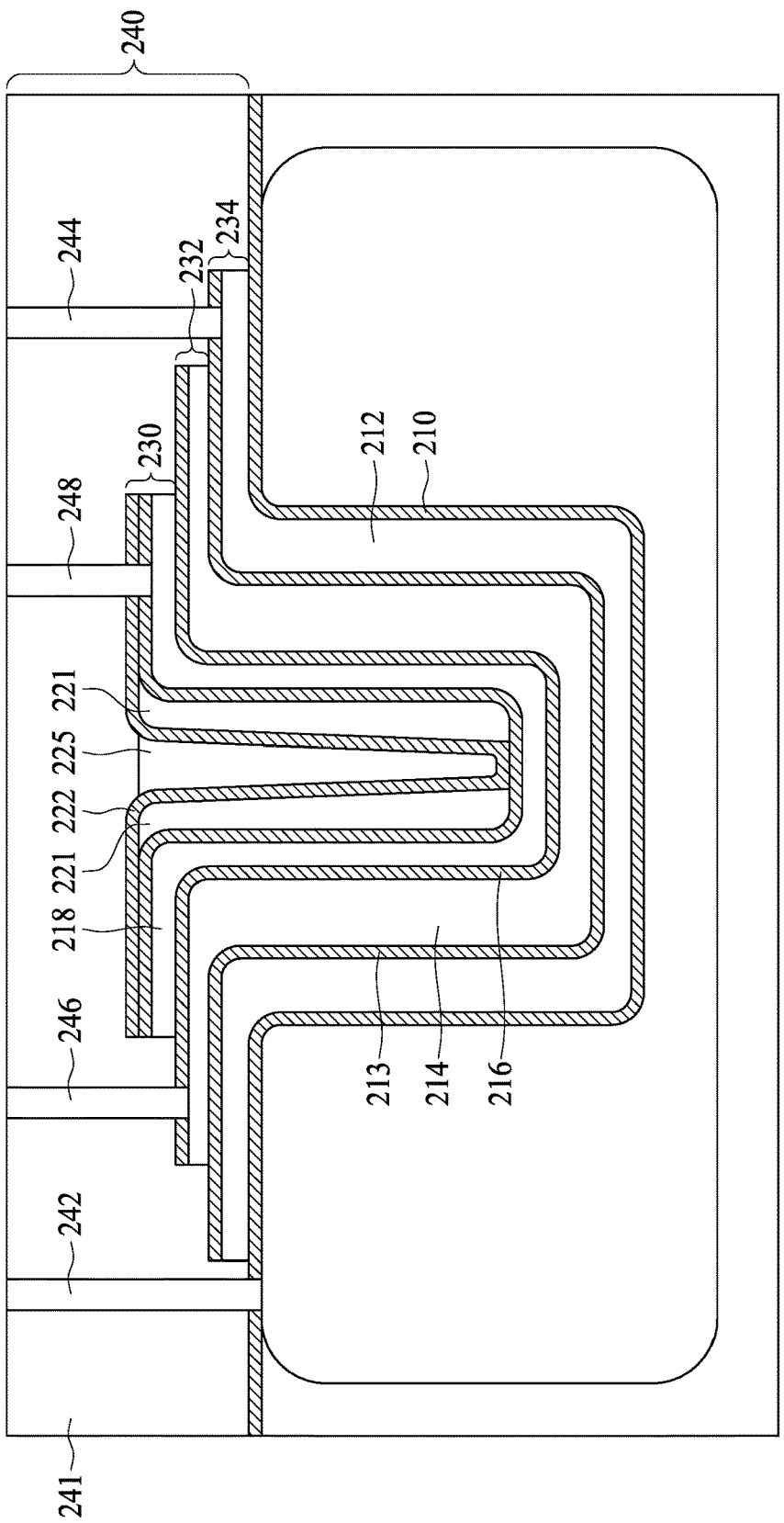

Referring to FIG. 2R, the interconnect structure 240 is formed over the semiconductive substrate 202, the capacitor 205 and the plug 224. The ILD 241 may be formed by a variety of techniques for forming such structure, e.g., chemical vapor deposition (CVD), low-pressure CVD (LPCVD), plasma-enhanced CVD (PECVD), sputtering and physical vapor deposition (PVD), thermal growing, and the like. Then, conductive vias 242, 244, 246 and 248 are formed within the ILD 241 in FIG. 2S. An exemplary operation forming the conductive via is depicted in the following. A photoresist (not shown) is patterned over the ILD 241 for forming patterned via holes. Subsequently, conductive metal fills the vias through, for example, a conventional Damascene operation. The photoresist is striped after the holes are formed. In some embodiments, the patterned holes are filled by an electroplating operation. Then, excessive portions of the conductive material are removed from the top surface using a chemical mechanical polishing (CMP) operation, an etch operation, or combinations thereof.

Figure 2T:
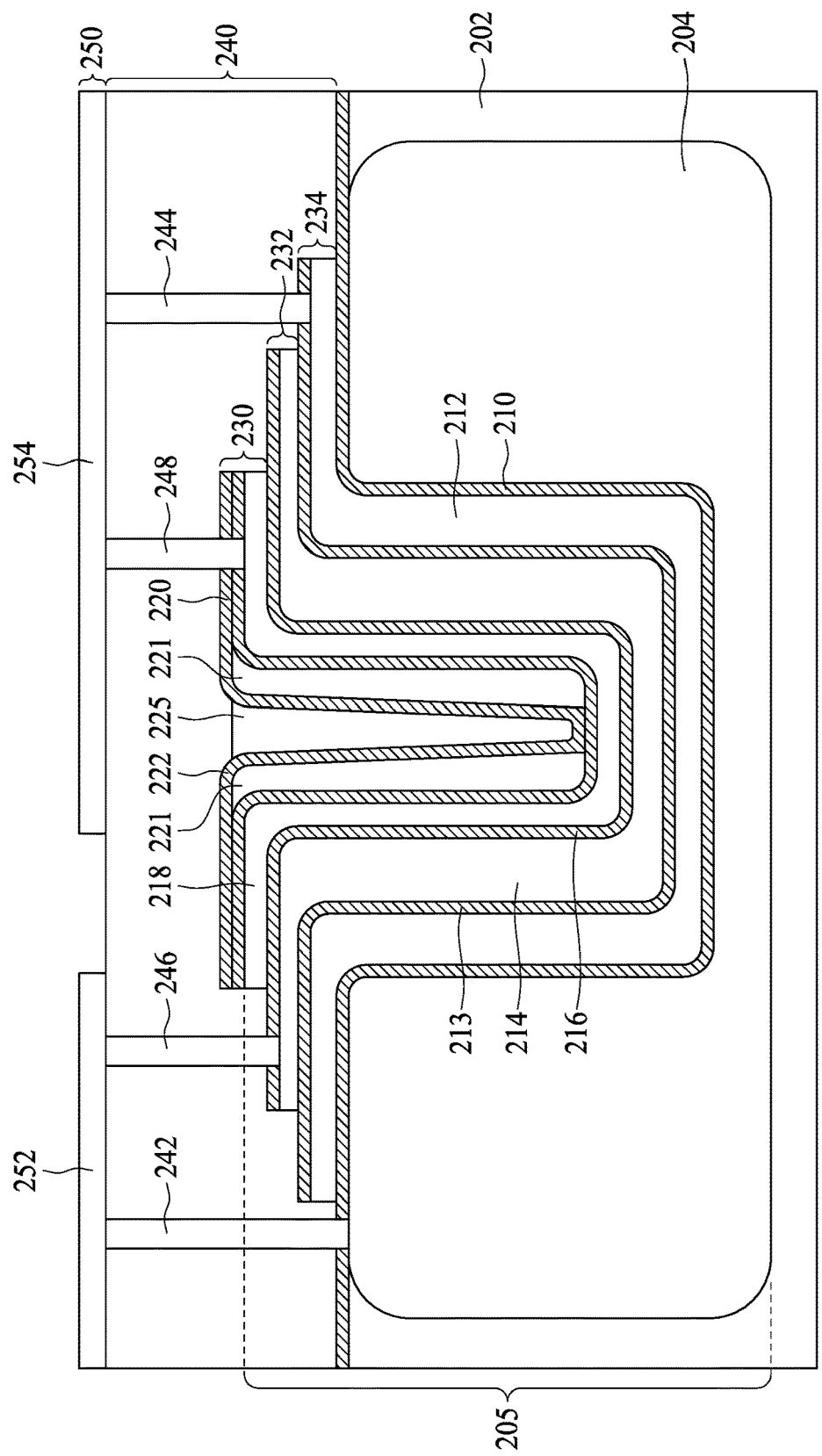

In FIG. 2T, the metal layer 250 is formed over the interconnect structure 240. A photoresist (not shown) is patterned over the ILD 241, and metal lines 252 and 254 are formed at the locations corresponding to conductive vias 242, 244, 246 and 248 by a deposition operation. The photoresist is then stripped off.

The present disclosure provides several advantages for implementing deep trench capacitors. A plug fills the trench successfully without gaps, voids or seams left inside the trench. The filling materials can be dielectric materials, semiconductive materials or conductive materials. In addition, the trench may be configured to include a tapered shape before the plug is formed in the trench, which improves the fill performance of the plug. Such arrangements can strengthen the structure of the capacitor and the wafer in which the capacitor is disposed. The risk of a wafer cracking due to foreign stress is thus eliminated.

According to an embodiment of the present disclosure, a method of manufacturing a semiconductor structure includes: providing a semiconductive substrate; forming a doped region in the semiconductive substrate; forming a trench in the doped region; forming a capacitor in the trench, the capacitor comprising alternatingly arranged electrodes and dielectric layers; depositing a first dielectric material in the trench and over the capacitor; etching the first dielectric material to form a spacer on a sidewall of a topmost dielectric layer of the capacitor; and depositing a core portion in the trench and laterally surrounded by the spacer.

According to an embodiment of the present disclosure, a method of manufacturing a semiconductor structure includes: providing a semiconductive substrate; forming a doped region in the semiconductive substrate; etching a trench in the doped region; forming alternating conductive layers and dielectric layers in the trench to form a capacitor; forming a spacer in the trench and over the capacitor; and depositing a core portion to fill the trench, the core portion being laterally surrounded by the spacer.

According to an embodiment of the present disclosure, a method of manufacturing a semiconductor structure includes: providing a semiconductive substrate; forming a doped region in the semiconductive substrate; etching a first trench in the doped region; forming alternating conductive layers and dielectric layers in the first trench to form a capacitor and a second trench in the capacitor; and forming a multilayer structure in the second trench. The forming of the multilayer includes: depositing a spacer on a sidewall of the second trench; depositing a dielectric layer to cover the spacer and the capacitor; depositing a core portion material over the dielectric layer to fill the second trench; and recessing the core portion material to below an upper surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   providing a semiconductive substrate;
   forming a doped region in the semiconductive substrate;
   forming a trench in the doped region;
   forming a capacitor in the trench, the capacitor comprising alternatingly arranged electrodes and dielectric layers;
   depositing a first dielectric material in the trench and over the capacitor;
   etching the first dielectric material to form a spacer on a sidewall of a topmost dielectric layer of the capacitor; and
   depositing a core portion in the trench and laterally surrounded by the spacer.

2. The method of claim 1, wherein etching the first dielectric material to form a spacer on a sidewall of a topmost dielectric layer of the capacitor comprises etching a bottom portion of the topmost dielectric layer of the capacitor.

3. The method of claim 2, wherein a portion of an electrode of the capacitor is exposed to the trench through the etched bottom portion of the topmost dielectric layer of the capacitor.

4. The method of claim 1, wherein the core portion comprises a conductive material.

5. The method of claim 4, wherein the core portion is electrically coupled to one of the electrodes of the capacitor.

6. The method of claim 1, wherein the core portion comprises a top surface and a bottom surface, the top surface having a width greater than a width of the bottom surface.

7. The method of claim 1, further comprising forming a dielectric layer over the spacer prior to depositing the core portion in the trench.

8. The method of claim 7, wherein a bottom portion of the dielectric layer is in contact with the topmost dielectric layer of the capacitor.

9. The method of claim 7, further comprising patterning the dielectric layer and the capacitor such that the topmost dielectric layer of the capacitor and the dielectric layer have coplanar sidewalls.

10. The method of claim 7, further comprising etching the core portion to below an upper surface of the dielectric layer.

11. The method of claim 1, wherein the trench has an aspect ratio between about 30 and about 1000.

12. A method of manufacturing a semiconductor structure, comprising:
   providing a semiconductive substrate;
   forming a doped region in the semiconductive substrate;
   etching a trench in the doped region;
   forming alternating conductive layers and dielectric layers in the trench to form a capacitor;
   forming a spacer in the trench and over the capacitor; and
   depositing a core portion to fill the trench, the core portion being laterally surrounded by the spacer.

13. The method of claim 12, wherein the doped region has a conductivity type opposite to a conductivity type of the semiconductive substrate.

14. The method of claim 12, wherein forming a spacer in the trench comprises exposing a portion of a topmost dielectric layer of the capacitor to the trench.

15. The method of claim 12, wherein each of the conductive layers extends over a portion of a top surface of the semiconductive substrate.

16. The method of claim 12, wherein the doped region is electrically insulated from one of the plurality of conductive layers of the capacitor.

17. The method of claim 12, further comprising forming an interconnect structure comprising a plurality of conductive vias electrically coupled to the conductive layers of the capacitor.

18. The method of claim 17, wherein the core portion is spaced apart from each of the conductive vias.

19. The method of claim 17, wherein each of the conductive vias terminates on a horizontal portion of a respective conductive layer of the capacitor.

20. A method of manufacturing a semiconductor structure, comprising:
   providing a semiconductive substrate;
   forming a doped region in the semiconductive substrate;
   etching a first trench in the doped region;
   forming alternating conductive layers and dielectric layers in the first trench to form a capacitor and a second trench in the capacitor; and
   forming a multilayer structure in the second trench, comprising:
      depositing a spacer on a sidewall of the second trench;
      depositing a dielectric layer to cover the spacer and the capacitor;
      depositing a core portion material over the dielectric layer to fill the second trench; and
      recessing the core portion material to below an upper surface of the dielectric layer.

* * * * *